(12) United States Patent
Higashi et al.

(10) Patent No.: US 8,044,429 B2
(45) Date of Patent: Oct. 25, 2011

(54) LIGHT-EMITTING DEVICE AND METHOD FOR MANUFACTURING THE SAME

(75) Inventors: Mitsutoshi Higashi, Nagano (JP); Masahiro Sunohara, Nagano (JP); Yuichi Taguchi, Nagano (JP); Akinori Shiraishi, Nagano (JP); Kei Murayama, Nagano (JP); Naoyuki Koizumi, Nagano (JP); Hideaki Sakaguchi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 12 days.

(21) Appl. No.: 12/907,594

(22) Filed: Oct. 19, 2010

(65) Prior Publication Data

US 2011/0032710 A1 Feb. 10, 2011

Related U.S. Application Data

(62) Division of application No. 11/673,818, filed on Feb. 12, 2007, now Pat. No. 7,838,897.

(30) Foreign Application Priority Data

Feb. 16, 2006 (JP) ................................. 2006-038950

(51) Int. Cl.
*H01L 29/267* (2006.01)
*H01L 29/16* (2006.01)

(52) U.S. Cl. .................... 257/99; 257/100; 257/E23.181
(58) Field of Classification Search .................... 257/99, 257/100, E23.181
See application file for complete search history.

(56) References Cited

U.S. PATENT DOCUMENTS

| 6,483,623 | B1 | 11/2002 | Maruyama |
| 6,828,590 | B2 | 12/2004 | Hsiung |
| 7,180,240 | B2 * | 2/2007 | Noguchi et al. ............... 313/512 |
| 2003/0107316 | A1 | 6/2003 | Murakami |
| 2004/0041222 | A1 | 3/2004 | Loh |
| 2005/0093116 | A1 | 5/2005 | Palmteer et al. |
| 2005/0225222 | A1 | 10/2005 | Mazzochette |

FOREIGN PATENT DOCUMENTS

JP 2005-311314 11/2005

* cited by examiner

*Primary Examiner* — Jenny L. Wagner
(74) *Attorney, Agent, or Firm* — Rankin, Hill & Clark LLP

(57) ABSTRACT

A light-emitting device including a light-emitting element and a substrate where the light-emitting element is arranged. A housing part housing the light-emitting element and having a shape that is tapered upward from the substrate and a metal frame surrounding the light-emitting element and including the side face of the housing part made into an almost mirror-polished surface are provided on the substrate.

4 Claims, 33 Drawing Sheets

31A  31B    31B   31A

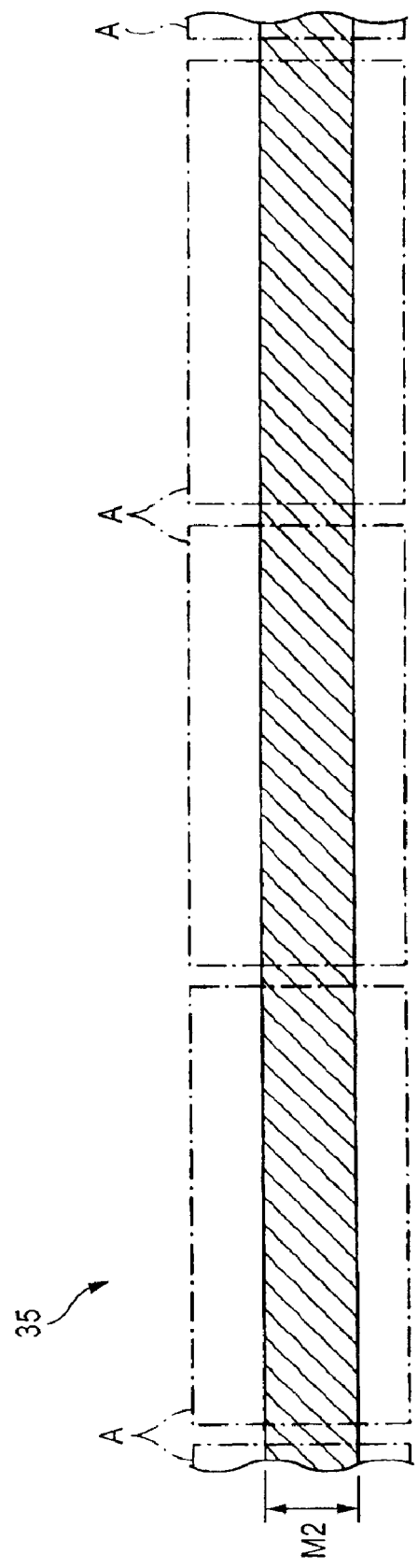

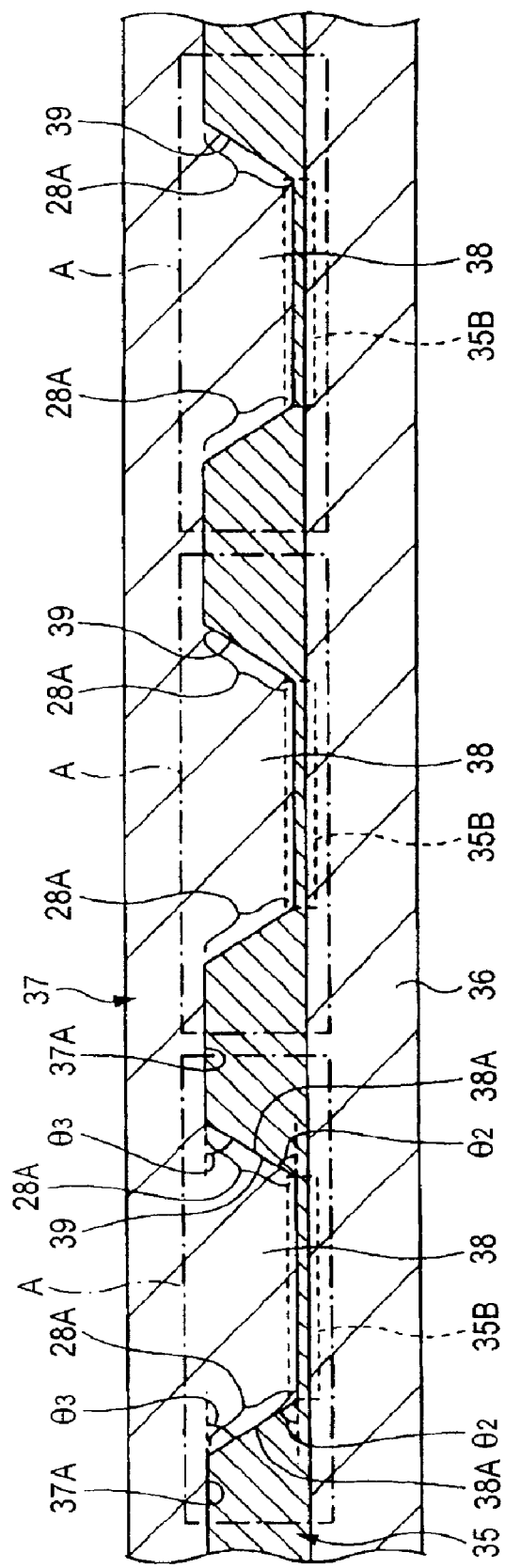

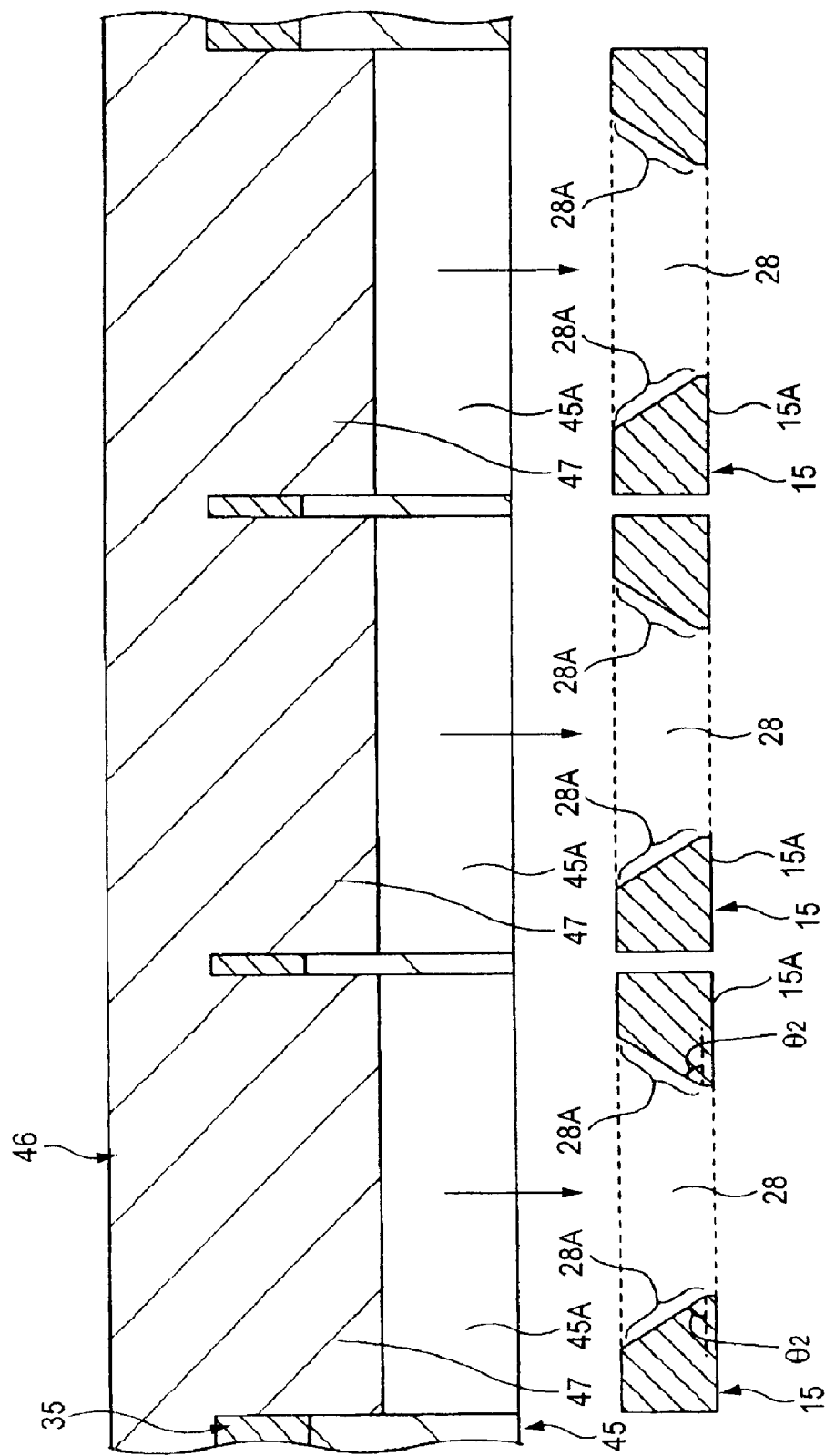

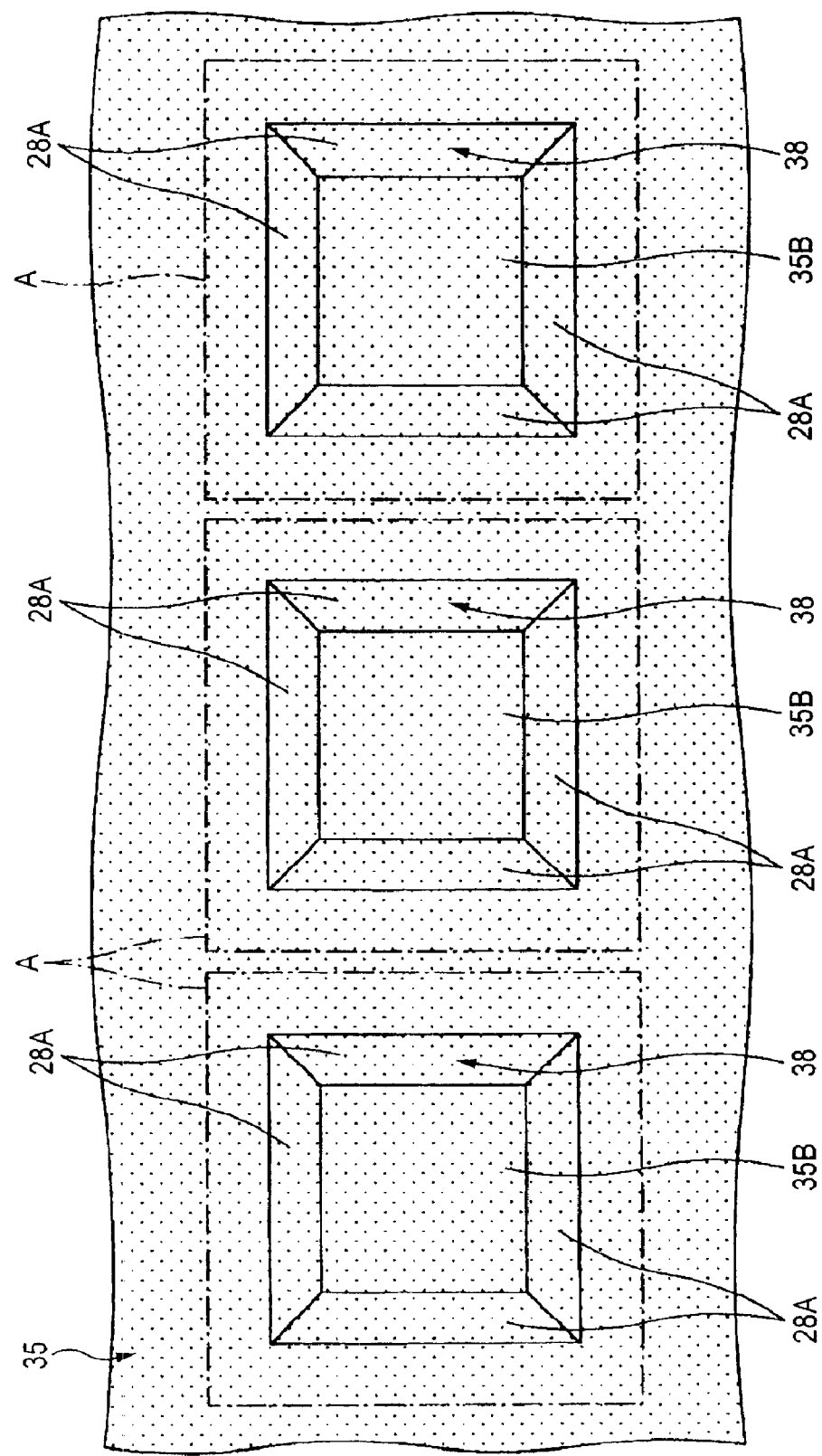

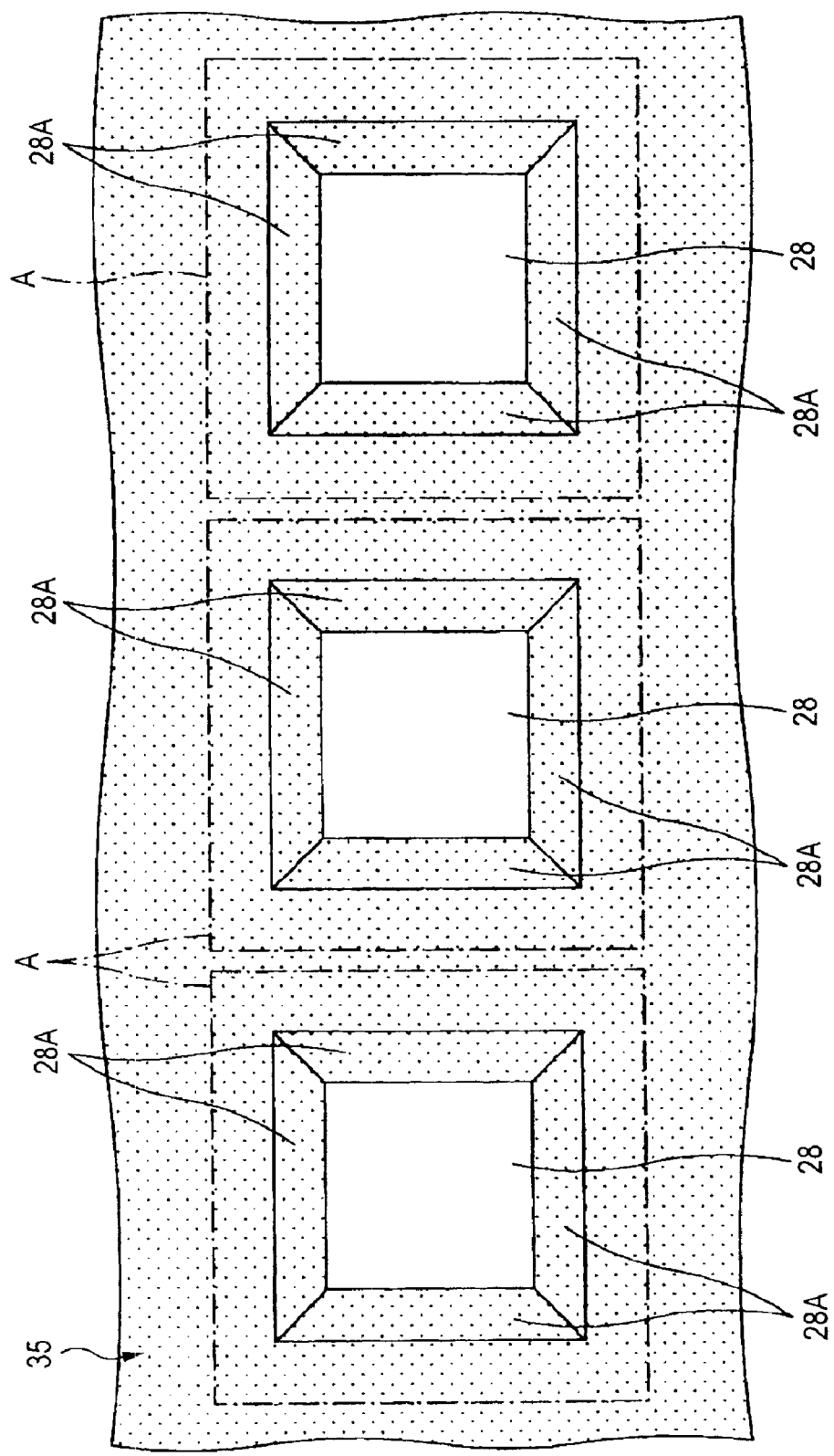

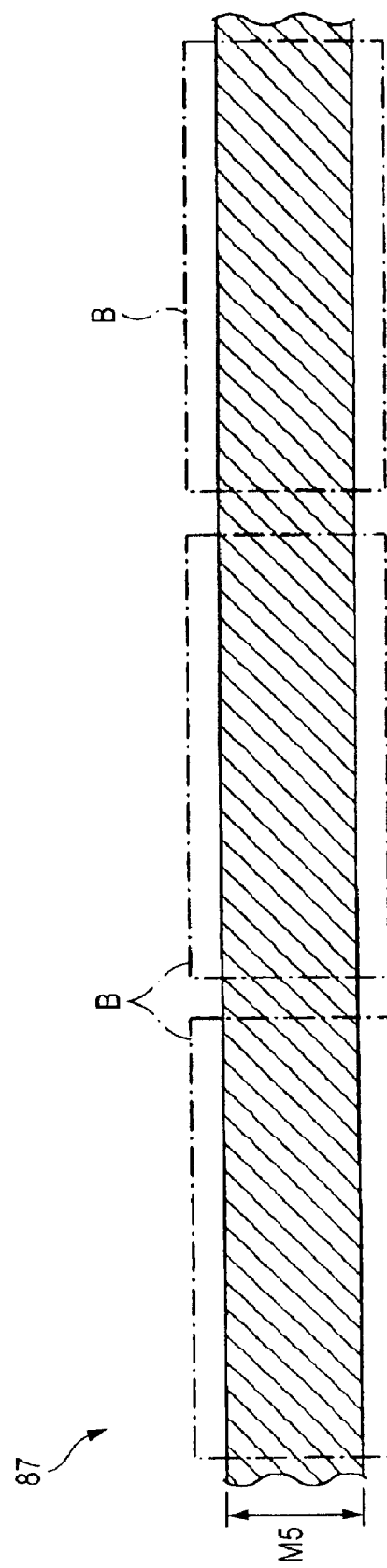

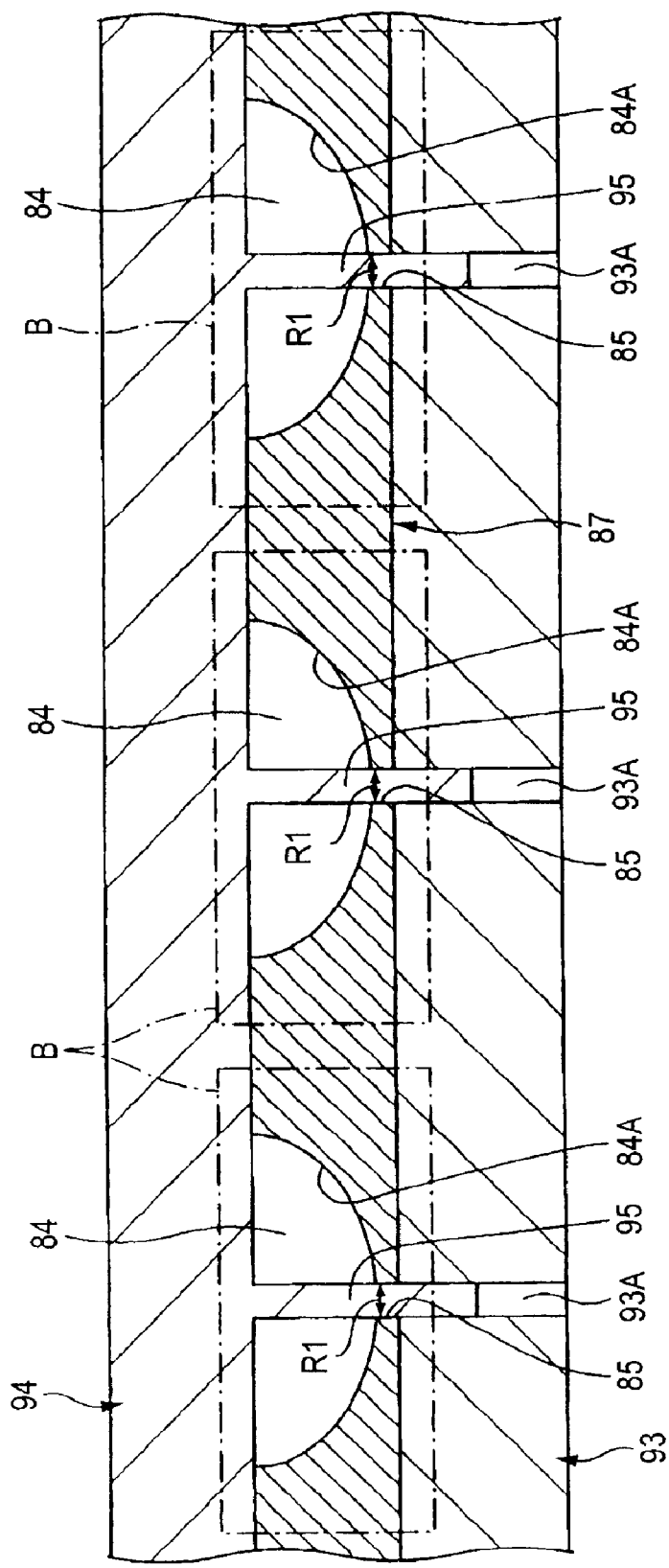

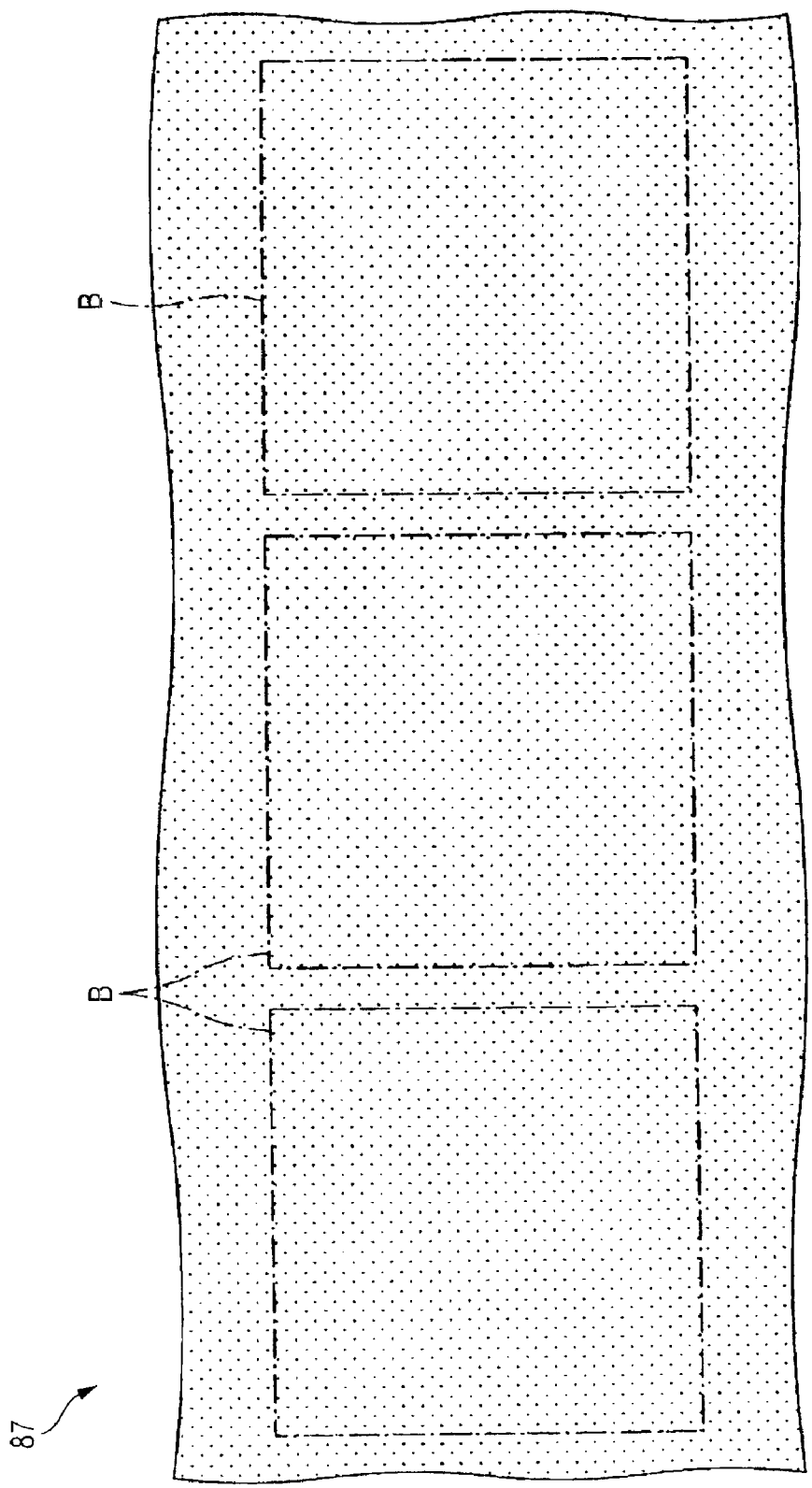

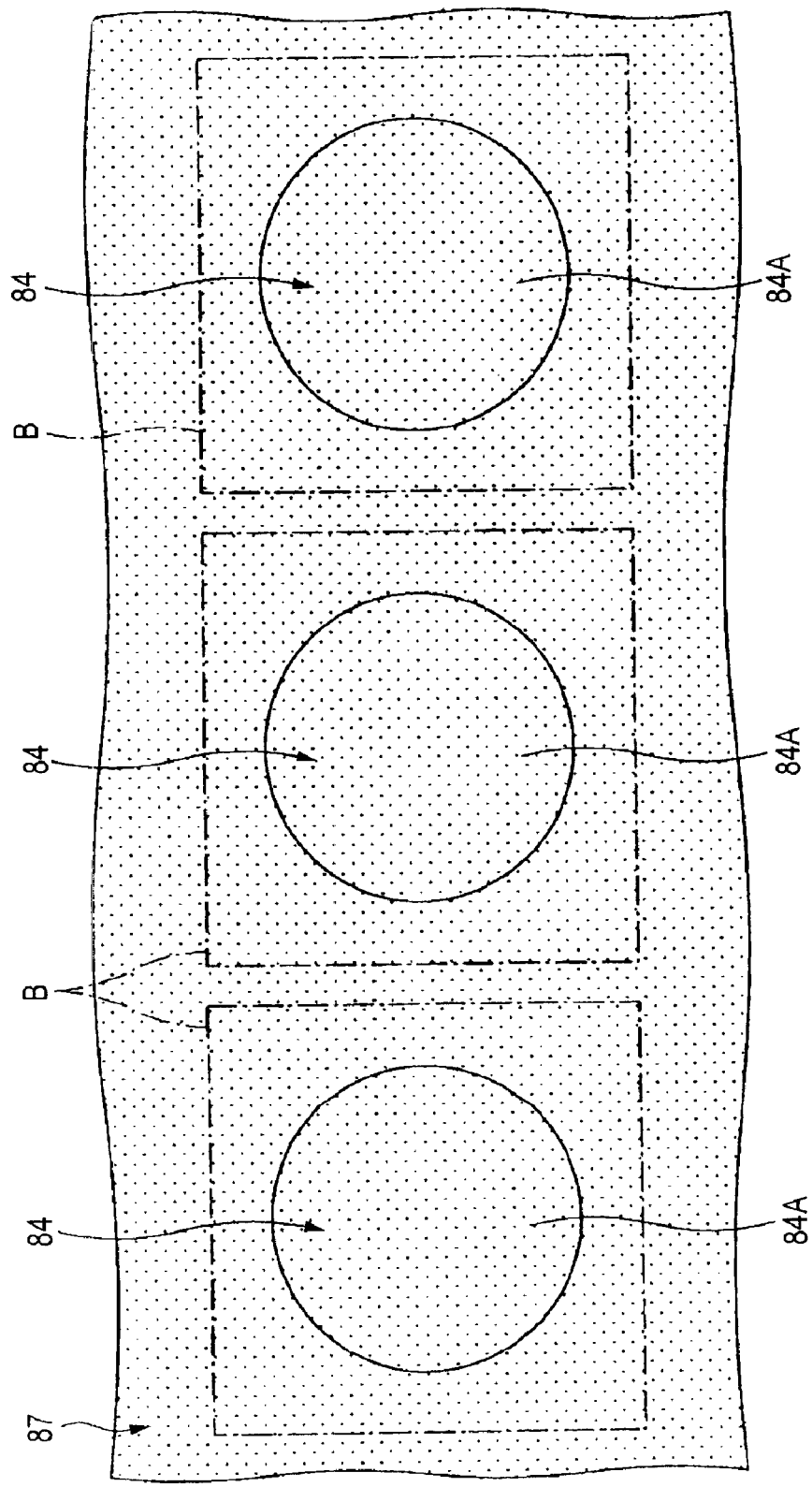

LIGHT-EMITTING DEVICE AND METHOD FOR MANUFACTURING THE SAME

BACKGROUND OF THE INVENTION

The present invention relates to a light-emitting device and its manufacturing method and in particular to a light-emitting device that uses a face of a housing part for housing a light-emitting element as a reflector and its manufacturing method.

FIG. 1 is a cross-sectional view of a related art light-emitting device. θ1 shown in FIG. 1 represents the inclination angle of the side face 109A of a housing part 109 with respect to the bottom face 109B of the housing part 109 (hereinafter referred to as the "inclination angle θ1").

Referring to FIG. 1, the related art light-emitting device 100 includes a substrate 101, a light-emitting element 102, a phosphor-containing resin 103, and a sealing resin 104.

The substrate 101 includes a substrate main body 106 and a wiring pattern 107. The substrate main body 106 includes a housing part 109 and a plurality of through holes 111. The housing part 109 is intended to house the light-emitting element 102. The housing part 109 has a shape that is tapered upward from the bottom 109B of the housing part 109.

The side face 109A of the housing part 109 is an inclined surface forming an inclination angle θ1 with respect to the bottom face 109B of the housing part 109. The side face 109A of the housing part 109 is arranged to surround the light-emitting element 102. The side face 109A of the housing part 109 functions as a reflector to reflect light emitted from the light-emitting element 102. A material for the substrate main body 106 may be ceramic or a resin. Note that a resin has a problem that it is deteriorated by ultraviolet rays contained in the light emitted from the light-emitting element 102 and thus ceramic is preferable as a material for the substrate main body 106. In case ceramic is used as a material for the substrate main body 106, the housing part 109 is formed by countersinking (scraping) a ceramic substrate.

The wiring pattern 107 is arranged to fill the through holes 111 and reach the lower face 106A of the substrate main body 106 via the through holes 111. The light-emitting element 102 is flip-chip connected to the wiring pattern 107 via a bump 112.

The phosphor-containing resin 103 is arranged to cover the light-emitting element 102. The sealing resin 104 is arranged on the housing part 109 so as to seal the light-emitting element 102 covered with the phosphor-containing resin 103. (For example, refer to Patent Reference 1.)

[Patent Reference 1] JP-A-2005-311314

However, the related art light-emitting device 100 forms a housing part 109 by countersinking (scraping) a ceramic substrate, so that it is impossible to obtain a sufficient flatness of the side face 109A of the housing part 109 and it is thus difficult to efficiently reflect the light emitted by the light-emitting element 102 with the side face 109A of the housing part 109. This results in a problem that the lighting efficiency of the light-emitting device 100 is reduced.

The related art light-emitting device 100 has a housing part 109 formed on a substrate 101. For example, to change the inclination angle θ1 of the side face 109A of the housing part 109, the entire substrate 101 must be replaced with another substrate, which adds to the costs of the light-emitting device 100.

SUMMARY OF THE INVENTION

An object of the invention is to provide a light-emitting device capable of readily changing the shape of a housing part functioning as a reflector as well as improving the light-emitting efficiency and its manufacturing method.

According to an aspect of the invention, there is provided a light-emitting device including:
 a light-emitting element,
 a substrate where the light-emitting element is arranged, and
 a metal frame provided on the substrate including a housing part for housing the light-emitting element, the housing part having a shape that is tapered upward from the substrate.

With this invention, by separately forming a metal frame having a shape that is tapered upward from a substrate and a substrate, it is possible to provide on a substrate a metal frame having a face (a face functioning as a reflector) of a housing part made into an almost mirror-polished surface. This enhances the light-emitting efficiency of a light-emitting device.

By separately forming a metal frame and a substrate, a metal frame can be replaced with another on the same substrate. This makes it possible to readily change the inclination angle of the face of the housing part functioning as a reflector.

In the above light-emitting device, it is preferable that the substrate includes a metal frame inserting part where at least part of the metal frame is inserted, and
 a cutting part for allowing the external shape of the metal frame to be deformable is provided on the metal frame.

It is preferable that the above light-emitting device, further include:
 a reflecting member for reflecting light emitted from the light-emitting element, provided on the face of the housing part surrounding the light-emitting element.

According to another aspect of the invention, there is provided a light-emitting device including:
 a light-emitting element,
 a substrate where the light-emitting element is arranged, wherein
 a housing part for housing the light-emitting element and a metal cover including through holes for transmitting light emitted from the light-emitting element are provided on the substrate.

With this invention, by separately forming a housing part for housing a light-emitting element, a metal cover including through holes for transmitting light emitted from the light-emitting element and a substrate, it is possible to provide on a substrate a metal cover having a face (a face functioning as a reflector) of a housing part made into an almost mirror-polished surface. This enhances the light-emitting efficiency of a light-emitting device.

By separately forming a metal cover and a substrate, a metal cover can be replaced with another on the same substrate. This makes it possible to readily change the size of the through holes.

It is preferable that the above light-emitting device, further includes:
 a reflecting member for reflecting light emitted from the light-emitting element, provided on the face of the metal cover surrounding the light-emitting element.

According to another aspect of the invention, there is provided a method for manufacturing a light-emitting device including a light-emitting element, a substrate where the light-emitting element is arranged and a metal frame including a housing part for housing the light-emitting element, the housing part provided on the substrate and having a shape that is tapered upward from the substrate, the method including:

a metal plate preparation step of preparing a metal plate including a plurality of metal frame forming areas where the metal frame is formed, and a housing part forming step of forming, by way of press working, the housing part on the metal plate corresponding to the metal frame forming areas.

With this invention, it is possible to finish the face of a housing part functioning as a reflector into an almost mirror-polished surface by forming, by way of press working, the housing part on a metal plate. This enhances the light-emitting efficiency of a light-emitting device.

It is preferable that the above method for manufacturing a light-emitting device, further includes:

a metal plate cutting step of cutting the metal plate along the external shape positions of the metal frame forming areas by way of press working after the housing part forming step.

It is preferable that the above method for manufacturing a light-emitting device, further includes:

a reflecting member forming step of forming a reflecting member for reflecting light emitted from the light-emitting element on the face of the housing part surrounding the light-emitting element between the housing part forming step and the metal plate cutting step.

According to another aspect of the invention, there is provided a method for manufacturing a light-emitting device including a light-emitting element, a substrate where the light-emitting element is arranged and a metal frame including a housing part for housing the light-emitting element, the housing part having a shape that is tapered upward from the substrate, the substrate including a metal frame inserting part where at least part of the metal frame is inserted, wherein the method including:

a metal plate preparation step of preparing a metal plate including a plurality of metal frame forming areas where the metal frame is formed, a housing part forming step of forming, by way of press working, the housing part on the metal plate corresponding to the metal frame forming areas, and a cutting part forming step of forming on the metal plate a cutting part to allow the external shape of the metal frame to be deformable.

With this invention, it is possible to finish the face of a housing part functioning as a reflector into an almost mirror-polished surface by forming, by way of press working, the housing part on a metal plate. This enhances the light-emitting efficiency of a light-emitting device.

It is possible to mount a metal frame at the metal frame inserting part of a substrate without using an adhesive by forming on the metal frame a cutting part to allow the external shape of the metal frame to be deformable.

According to another aspect of the invention, there is provided a method for manufacturing a light-emitting device including a light-emitting element, a substrate where the light-emitting element is arranged, a housing part arranged on the substrate for housing the light-emitting element and a metal cover including through holes for transmitting light emitted from the light-emitting element, wherein the method including:

a metal plate preparation step of preparing a metal plate including a plurality of metal frame forming areas where the metal cover is formed, a housing part forming step of forming, by way of press working, the housing part on the metal plate corresponding to the metal frame forming areas, and a through hole forming step of forming, by way of press working, the through holes in the metal plate corresponding to a position where the housing part is formed.

With this invention, it is possible to finish the face of a housing part functioning as a reflector into an almost mirror-polished surface by forming, by way of press working, the housing part on a metal plate. This enhances the light-emitting efficiency of a light-emitting device.

With this invention, it is possible to readily change the shape of a housing part having a reflector function as well as enhance the light-emitting efficiency of a light-emitting device.

BRIEF DESCRIPTION OF THE DRAWINGS

FIG. 5D shows a step of manufacturing a light-emitting device according to the first embodiment of the invention.

FIG. 5E shows a step of manufacturing a light-emitting device according to the first embodiment of the invention.

FIG. 5G shows a step of manufacturing a light-emitting device according to the first embodiment of the invention.

FIG. 6B is a plan view of the metal plate shown in FIG. 5E including a plurality of recessed parts formed thereon.

FIG. 6C is a plan view of the metal plate shown in FIG. 5F including a plurality of housing parts formed thereon.

FIG. 19A shows a step of manufacturing a light-emitting device according to the fourth embodiment of the invention.

FIG. 19C shows a step of manufacturing a light-emitting device according to the fourth embodiment of the invention.

FIG. 20A is a plan view of the metal plate shown in FIG. 19A.

FIG. 20B is a plan view of the metal plate shown in FIG. 19B.

DETAILED DESCRIPTION OF THE PREFERRED EMBODIMENTS

Embodiments of the invention will be described based on figures.

First Embodiment

Figure 1:
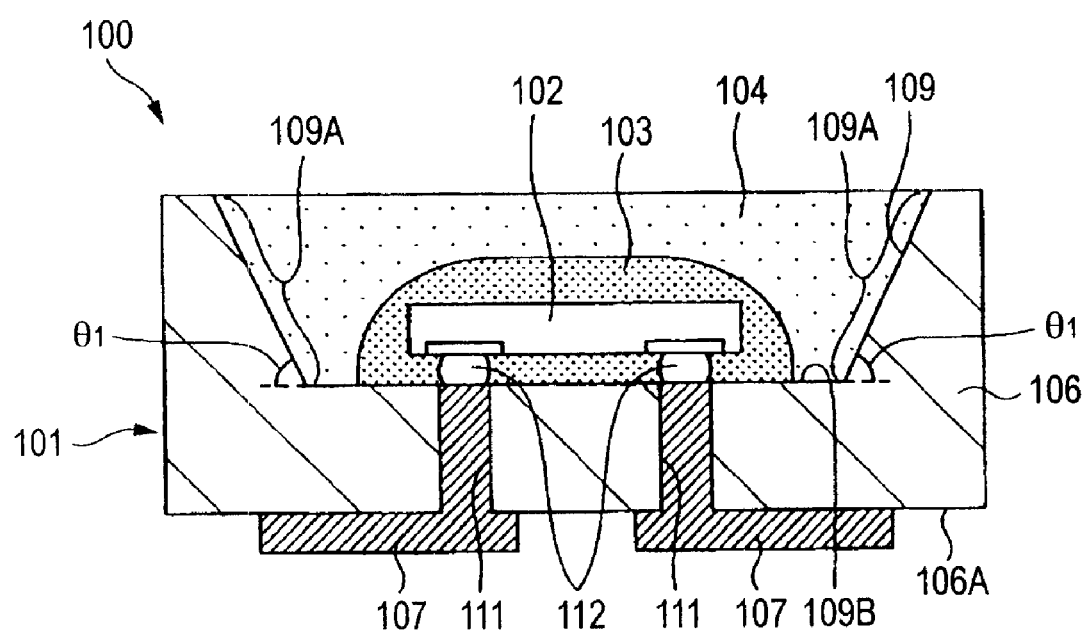
FIG. 1 is a cross-sectional view of a related art light-emitting device.
Figure 2:
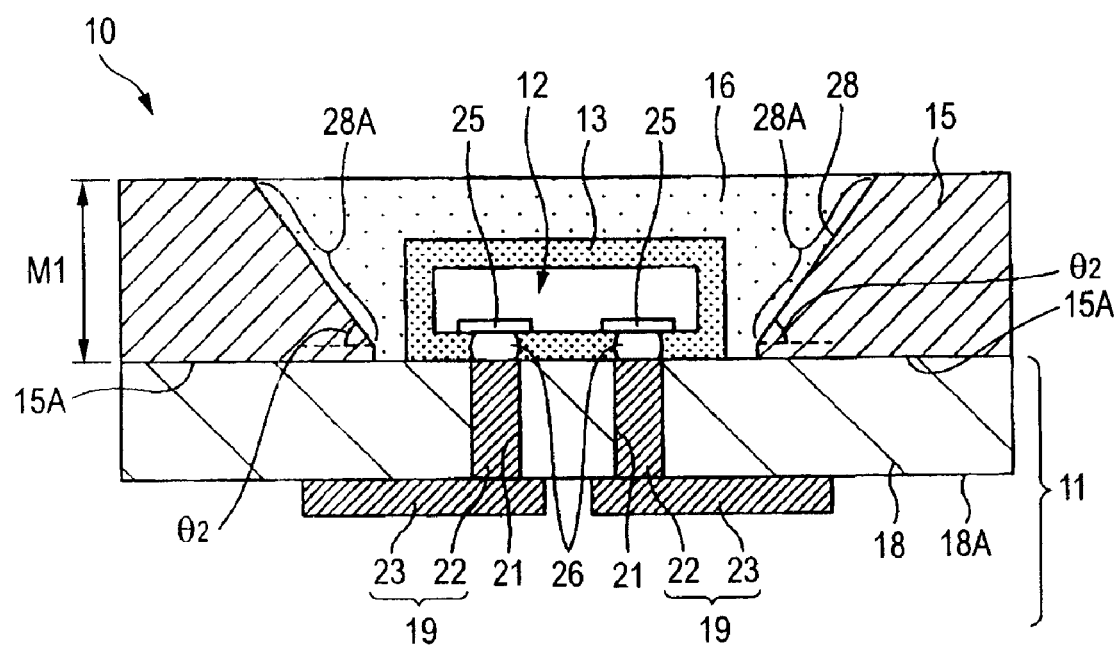
FIG. 2 is a cross-sectional view of a light-emitting device according to the first embodiment of the invention.

FIG. 2 is a cross-sectional view of a light-emitting device according to the first embodiment of the invention. θ2 shown in FIG. 2 represents the inclination angle of the side face 28A of a housing part 28 with respect to the bottom face 15A of a metal frame 15 (hereinafter referred to as the "inclination angle θ2").

Referring to FIG. 2, a light-emitting device 10 according to the first embodiment of the invention includes a substrate 11, a light-emitting element 12, a phosphor-containing resin 13, a metal frame 15 and a sealing resin 16.

The substrate 11 includes a substrate main body 18 and a wiring pattern 19. The substrate main body 18 has a shape of a plate and includes a plurality of through holes 21. The through holes 21 are intended to arrange vias 22. A material for the substrate main body 18 may be for example a resin, ceramic, glass, or silicon. In case silicon is used as a material for the substrate main body 18, an insulating layer (not shown) is provided between the substrate main body 18 and the wiring pattern 19.

The wiring pattern 19 includes vias 22 and wiring 23. Each via 22 is provided at the through hole 21. The upper end 1C of the via 22 is electrically connected to the electrode 25 of the light-emitting element 12 by way of a bump 26. The lower end of the via 22 is connected to the wiring 23. A material for the via 22 may be a conductive metal. A conductive metal as a material for the via 22 may be for example Cu.

The wiring 23 is provided on the lower face 18A of the substrate main body 18. The wiring 23 is connected to the lower end of the via 22. The wiring 23 is thus electrically connected to the light-emitting element 12 by way of the via 22 and a bump 26. The wiring 23 functions as an external connection terminal of the light-emitting device 10. A material for the wiring 23 may be a conductive metal. A conductive metal as a material for the wiring 23 may be for example a Cu/Ni/Au multilayer film including a Cu layer, an Ni layer and an Au layer laminated in this order on the lower face 18A of the substrate main body 18.

The light-emitting element 12 is an element that emits light and includes an electrode 25. The electrode 25 of the light-emitting element 12 is electrically connected to the via 22 via the bump 26. The light-emitting element 12 is flip-chip connected to the via 22. In case the light-emitting device 10 emits white light, for example, a light-emitting diode (LED) element that emits blue light may be used as the light-emitting element 12.

The phosphor-containing resin 13 is provided so as to cover the light-emitting element 12. The phosphor-containing resin 13 is a translucent resin into which phosphor particles are incorporated. A translucent resin may be for example a silicone resin.

By using a silicone resin as a translucent resin, it is possible to suppress the deterioration of the phosphor-containing resin 13 that occurs when ultraviolet rays contained in the light emitted from the light-emitting element 12 pass through the phosphor-containing resin 13.

In case the light-emitting device 10 emits white light, for example, phosphor particles that emit yellow light may be used as phosphor particles in the phosphor-containing resin 13. For example, a YAG phosphor may be used as a phosphor emitting yellow light.

Figure 3:
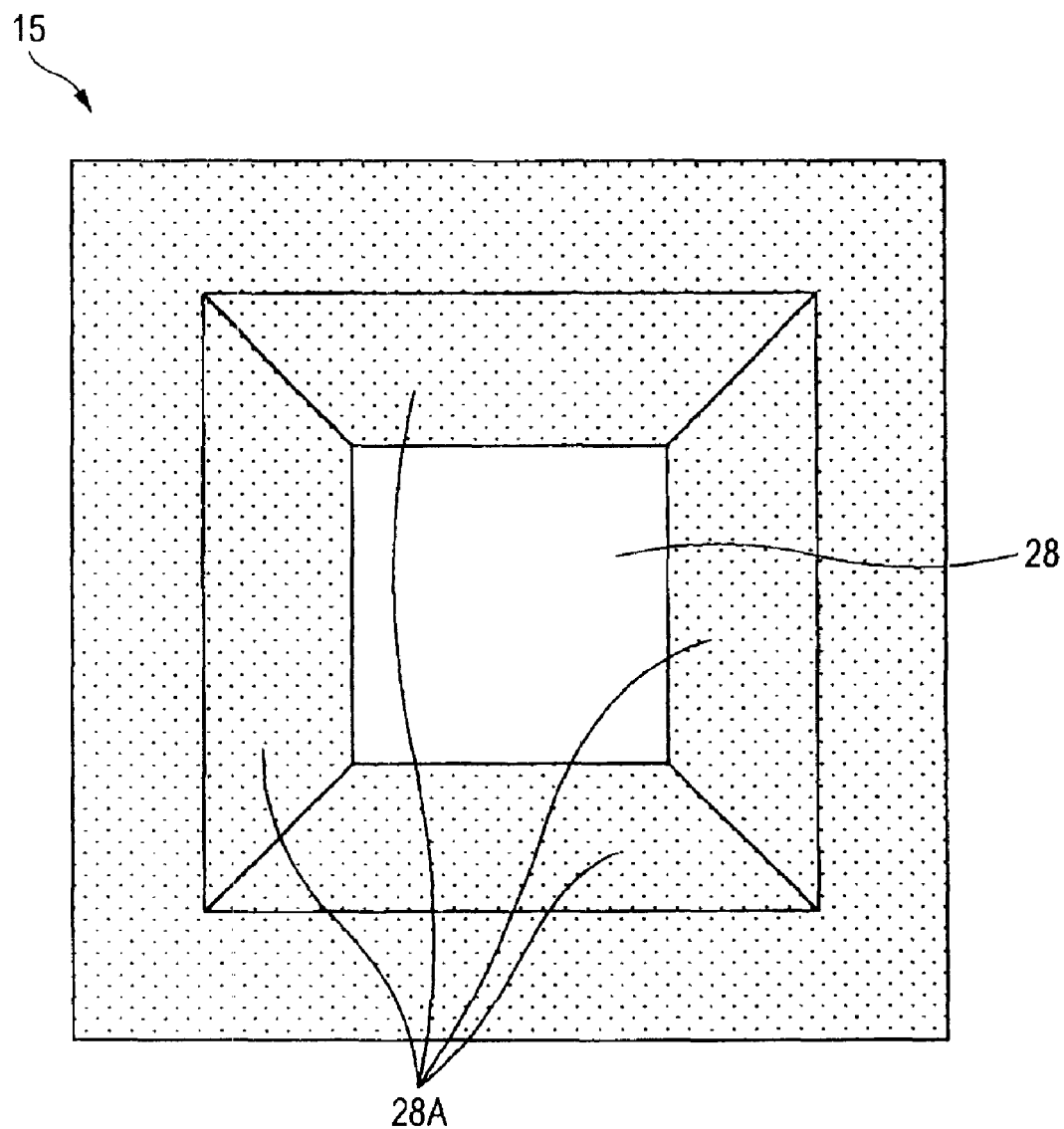
FIG. 3 is a plan view of the metal frame shown in FIG. 2.

FIG. 3 is a plan view of the metal frame shown in FIG. 2.

The metal frame 15 will be described referring to FIGS. 2 and 3. The metal frame 15 is fixed to the substrate 11 via an adhesive (not shown). The metal frame 15 and the substrate 11 are separately formed. The metal frame 15 has a shape of a frame surrounding the light-emitting element 12 and includes a housing part 28. The housing part 28 has a shape that is tapered upward from the substrate 11. The lower end of the housing part 28 has a quadrangular shape and the upper end of the housing part 28 is a quadrangle that is larger than the lower end of the housing part 28. The housing part 28 is intended to house the light-emitting element 12.

The housing part 28 includes a side face 28A surrounding the light-emitting element 12. The side face 28A of the housing part 28 is an inclined surface forming the inclination angle θ2 with respect to the bottom face 15A of the metal frame 15. The side face 28A of the housing part 28 functions as a reflector for reflecting light emitted from the light-emitting element 12. The inclination angle θ2 is an angle that allows light to be reflected in a desired direction. The inclination angle θ2 may be set for example within the range of 45 to 55 degrees. The housing part 28 may be formed for example through press working of a metal plate.

For example, one or more types of metal out of Cu, Fe, Au, Ag, Al, Ni, Pd and Pt may be used as a material for the metal frame 15. In particular, a Cu alloy or an Fe—Ni alloy is preferable as a material for the metal frame 15. In case the light-emitting element 12 is 80 micrometers thick, the thickness M1 of the metal frame 15 may be for example 120 micrometers.

As described above, by separately forming the metal frame 15 and the substrate 11, it is possible to provide on the substrate 11 the metal frame 15 including the side face 28A (a face functioning as a reflector) of the housing part 28 made into an almost mirror-polished surface. This enhances the light-emitting efficiency of the light-emitting device 10.

By separately forming the metal frame 15 and the substrate 11, the metal frame 15 can be replaced with another on the substrate 11. This makes it possible to readily change the inclination angle θ2 of the side face 28A of the housing part 28.

When the metal frame 15 on the substrate 11 is replaced with another metal frame, it is not necessary to change the configuration of the substrate 11. This reduces the costs of the light-emitting device 10 compared with the related art light-emitting device 100 including the substrate 101 with the housing part 109 arranged thereon.

The sealing resin 16 will be described referring to FIG. 2. The sealing resin 16 is formed on the housing part 28 so as to cover the phosphor-containing resin 13. The sealing resin 16 is intended to seal the light-emitting element 12 covered with the phosphor-containing resin 13. For example, a silicone resin may be used as the sealing resin 16.

According to the light-emitting device of this embodiment, by separately forming the metal frame 15 and the substrate 11, it is possible to provide on the substrate 11 the metal frame 15 including the side face 28A (a face functioning as a reflector) of the housing part 28 made into an almost mirror-polished surface. This enhances the light-emitting efficiency of the light-emitting device 10.

By separately forming the metal frame 15 and the substrate 11, the metal frame 15 can be replaced with another on the substrate 11. This makes it possible to readily change the inclination angle θ2 of the face 28A of the housing part 28 functioning as a reflector.

While the sealing resin 16 is provided on the light-emitting device 10 of this embodiment, this embodiment is applicable to a light-emitting device that does not include the sealing resin 16.

Figure 4:
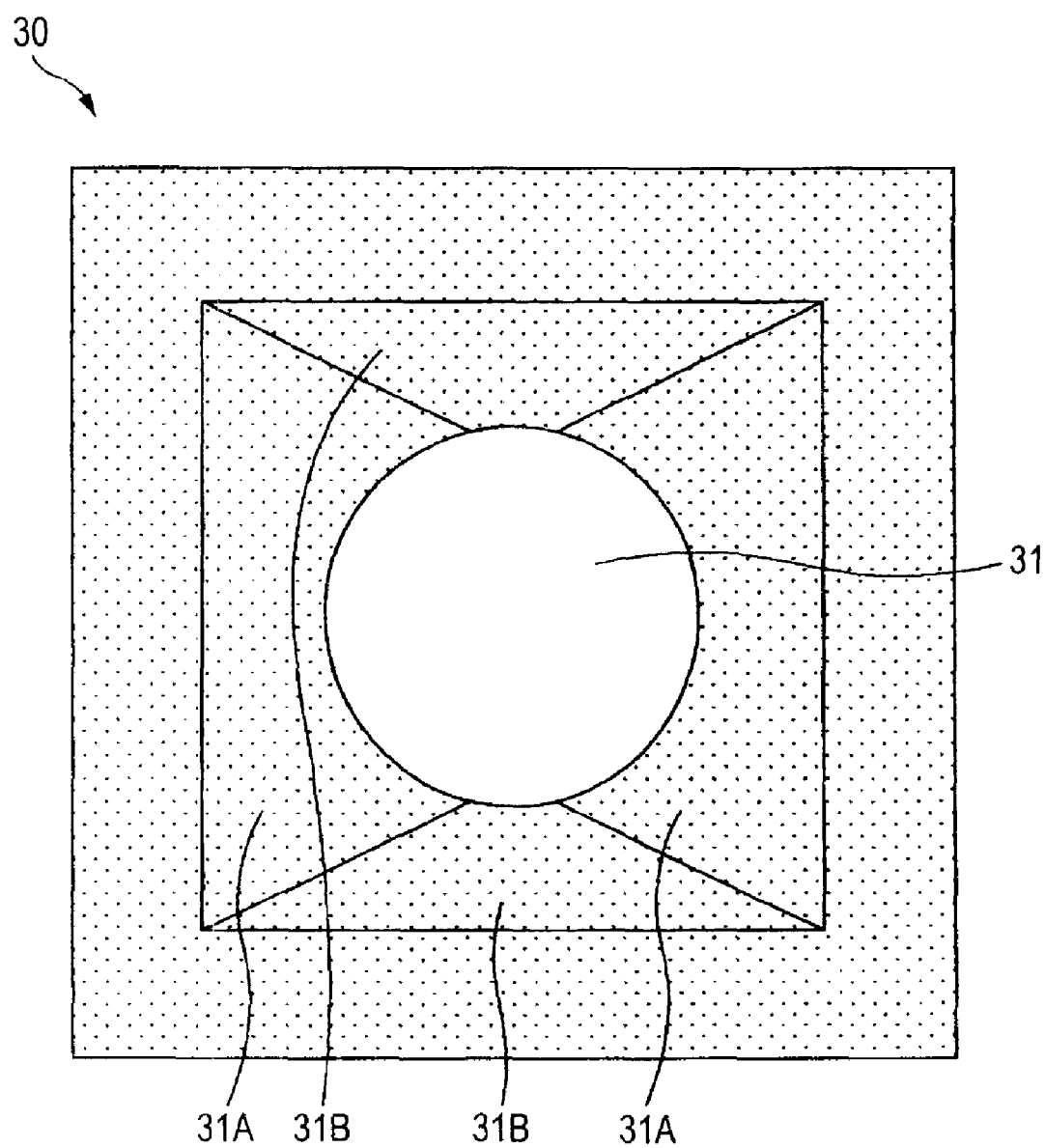
FIG. 4 is a plan view of another metal frame applicable to a light-emitting device of this embodiment.

FIG. 4 is a plan view of another metal frame applicable to a light-emitting device of this embodiment.

Referring to FIG. 4, the metal frame 30 includes a housing part 31 for housing a light-emitting element 12. The housing part 31 has a shape that is tapered from the lower end to the upper end of the housing part 31. The lower end of the housing part 31 is formed into a circle and the upper end of the housing part 31 is formed into a quadrangle. Side faces 31A, 31B of the housing part 31 are designed to surround the light-emitting element 12. The side faces 31A, 31B of the housing part 31 are formed into almost mirror-polished surfaces. The side faces 31A, 31B of the housing part 31 are inclined surfaces having a predetermined angle with respect to the bottom face of the metal frame 30. The predetermined angle may be set to an angle approximately equal to the inclination angle θ2 of the side face 28A of the housing part 28 described earlier (refer to FIG. 2). Each of the side faces 31A, 31B of the housing part 31 functions as a reflector that reflects light emitted from the light-emitting element 12.

The metal frame 30 thus configured may be provided on the substrate 11 in place of the metal frame 15. A light-emitting device including the substrate 11 with the metal frame 30 arranged thereon has the same advantage as that of the light-emitting device 10 of the first embodiment.

A metal frame arranged on the substrate 11 has only to include a housing part whose side face functioning as a reflector is formed into an almost mirror-polished surface, and is not limited to the shapes of the metal frame 15 and 30 shown in FIGS. 3 and 4.

Figure 5A:
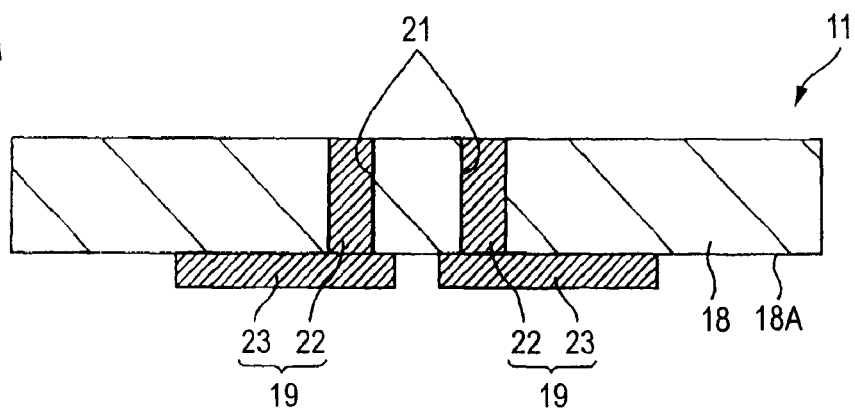
FIG. 5A shows a step of manufacturing a light-emitting device according to the first embodiment of the invention.
Figure 5B:
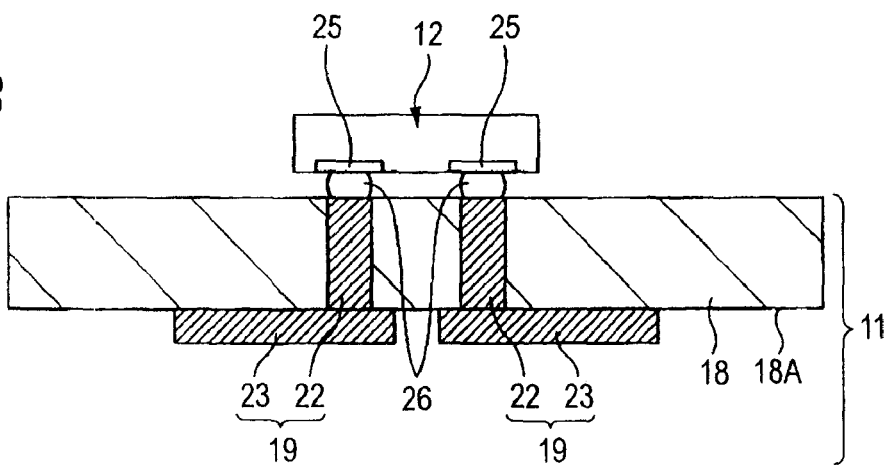
FIG. 5B shows a step of manufacturing a light-emitting device according to the first embodiment of the invention.
Figure 5C:
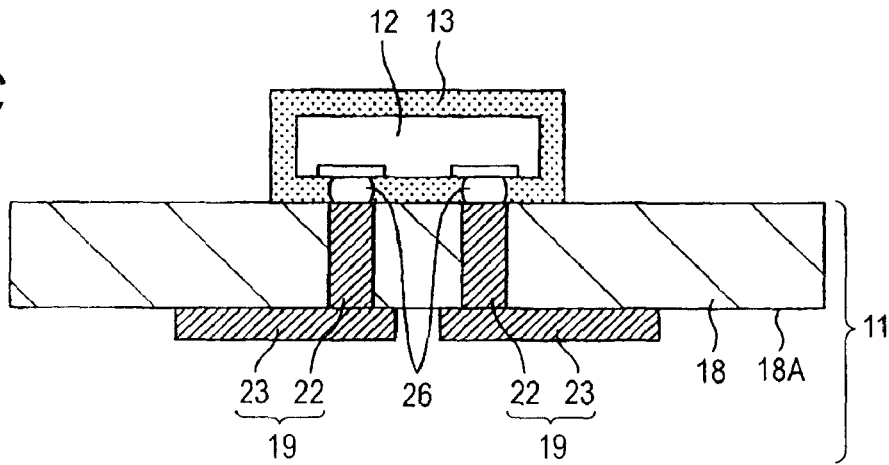
FIG. 5C shows a step of manufacturing a light-emitting device according to the first embodiment of the invention.
Figure 5F:
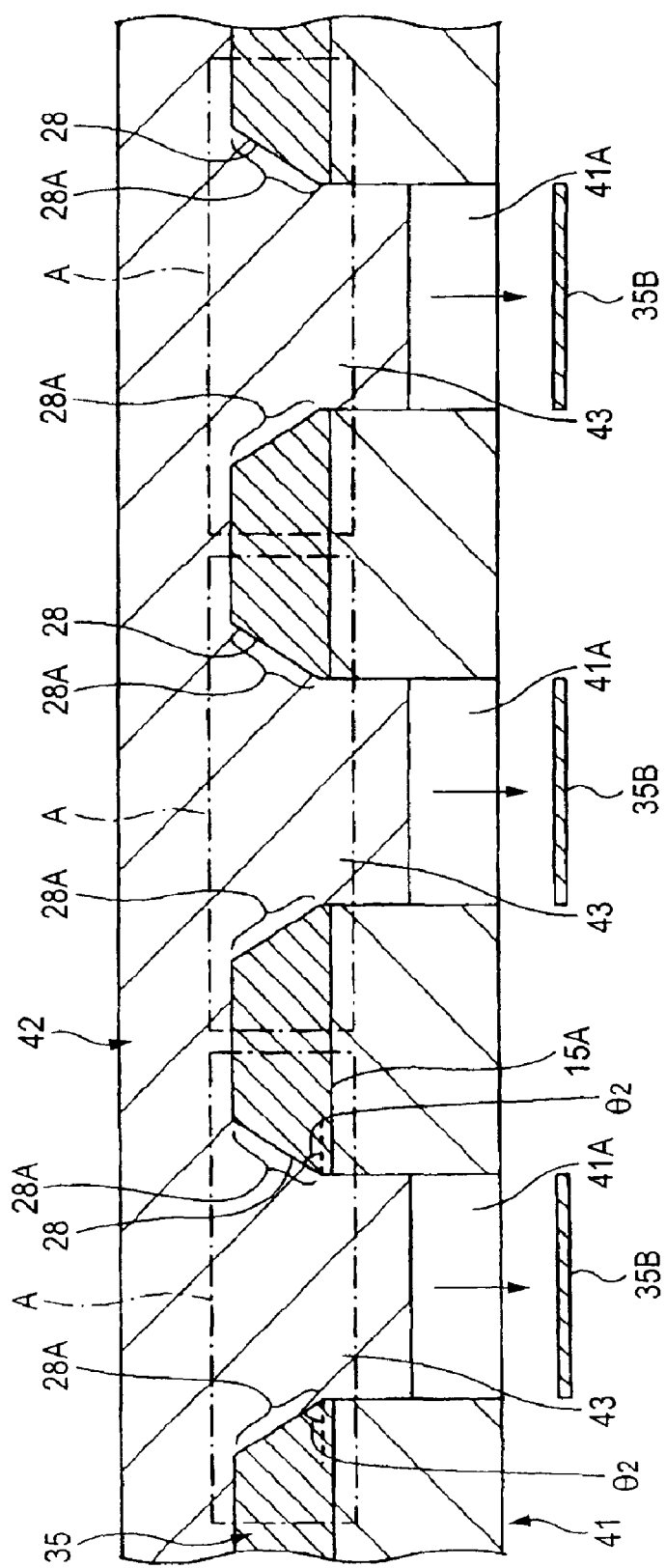
FIG. 5F shows a step of manufacturing a light-emitting device according to the first embodiment of the invention.

FIGS. 5A to 5I show the steps of manufacturing a light-emitting device according to the first embodiment of the invention. In FIGS. 5A to 5I, a same component as that of the light-emitting device 10 according to the first embodiment of the invention is given a same sign. A sign A shown in FIGS. 5D to 5F represents an area of the metal plate 35 where the metal frame 15 is formed (hereinafter referred to as the "metal frame forming area A").

Figure 6A:
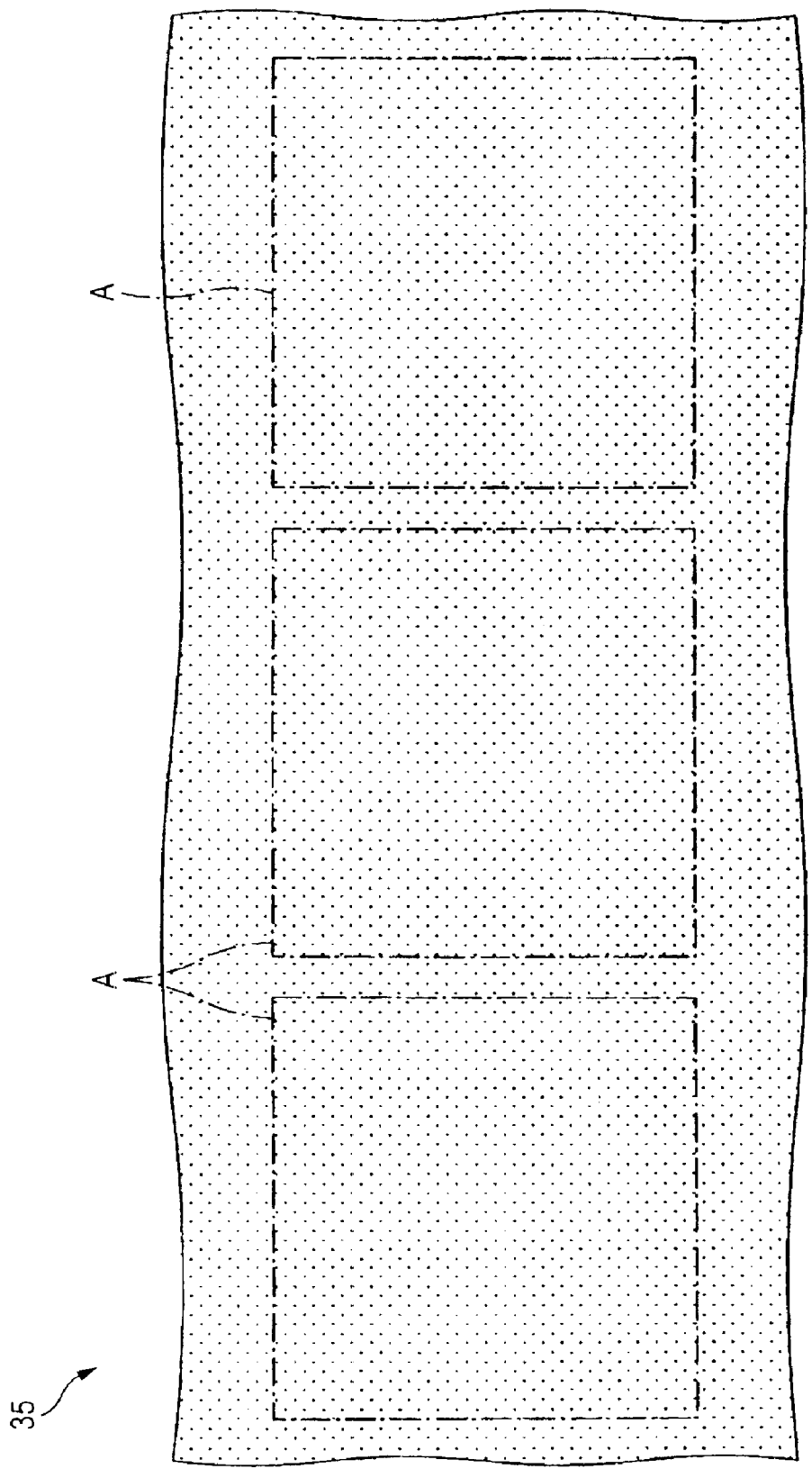
FIG. 6A is a plan view of the metal plate shown in FIG. 5D.

FIG. 6A is a plan view of the metal plate shown in FIG. 5D. FIG. 6B is a plan view of the metal plate including a plurality of recessed parts shown in FIG. 5E. FIG. 6C is a plan view of the metal plate including a plurality of housing parts formed thereon shown in FIG. 5F.

A method for manufacturing a light-emitting device 10 according to the first embodiment of the invention will be described referring to FIGS. 5A to 6C.

First, the step shown in FIG. 5A forms a substrate 11 including a substrate main body 18 including a plurality of through holes 21 and a wiring pattern 19 composed of vias 22 and a wiring 23 by way of a known technique.

To be more precise, in case the material for the substrate main body 18 is silicon, a plurality of through holes 21 are formed into the substrate main body 18 by way of dry etching, and an insulating layer (not shown) is formed on the surface of the substrate main body 18 (including the inner walls of the through holes 21). Next, a metal foil (not shown) is applied to the lower face 18A of the substrate main body 18 and a conductive metal film such as a Cu film is deposited and grown on the inner surfaces of the plurality of through holes 21 by way of the electroplating method using the metal foil as a power feed layer thereby forming vias 22. The metal foil is then removed. A Cu layer, an Ni layer and an Au layer are sequentially laminated on the lower face 18A of the substrate main body 18 to form a Cu/Ni/Au multilayer film by way of the sputtering method. An unnecessary part of the Cu/Ni/Au multilayer film is lifted off to form wiring 23.

The step shown in FIG. 5B flip-chip connects the light-emitting element 12 to a via 22. To be more precise, a bump 26 is formed on the upper end of the via 22 and the electrode 25 of the light-emitting element 12 is pressed against the bump 26 in a molten state to flip-chip connect the light-emitting element 12 to the via 22. In case the light-emitting device 10 emits white light, for example, a light-emitting diode (LED) element that emits blue light may be used as the light-emitting element 12.

Next, the step shown in FIG. 5C forms a phosphor-containing resin 13 so as to cover a light-emitting element 12. The phosphor-containing resin 13 may be formed through the inkjet method. The phosphor-containing resin 13 is a translucent resin into which phosphor particles are incorporated. For example, a silicone resin may be used as a translucent resin. In case the light-emitting device 10 emits white light, for example, phosphor particles that emit yellow light may be used as phosphor particles in the phosphor-containing resin 13. For example, a YAG phosphor may be used as a phosphor emitting yellow light.

The step shown in FIG. 5D prepares a metal plate 35 including a plurality of metal frame forming areas A (refer to FIG. 6A) (metal plate preparation step). For example, one or more types of metal out of Cu, Fe, Au, Ag, Al, Ni, Pd and Pt may be used as a material for the metal plate 35. In particular, a Cu alloy or an Fe—Ni alloy is preferable as a material for the metal plate 35. The thickness M2 of the metal plate 35 is set so as to be approximately equal to the thickness M1 of the metal frame 15. To be more precise, in case the light-emitting element 12 is 80 micrometers thick, the thickness M2 of the metal plate 35 may be for example 120 micrometers.

Next, the step shown in FIG. 5E presses the metal plate 35 by using a lower die 36 made into a plate and an upper die 37 including a plurality of protruding parts to form a recessed part 39 including a side face 28A formed into an almost mirror-polished surface on the metal plate corresponding to the metal frame forming areas A (refer to FIG. 6B). The protruding part 38 corresponds to the shape of the housing part 28. The face 38A of the protruding part 38 is an inclined surface. The inclination angle θ3 of the face 38A of the protruding part 38 with respect to the face 37A of the upper die 37 is set to be approximately equal to the inclination angle θ2 of the face 28A of the recessed part 39 (side face of the housing part 28). The inclination angle θ3 may be set for example within the range of 45 to 55 degrees. The recessed part 39 is made into the housing part 28 when an unnecessary metal plate part 35B located at the bottom face of the recessed part 39 is punched in the step shown in FIG. 5F.

Thus, by way of press working that uses the lower die 36 and the upper die 37, the side face 28A of the housing part 28 made into a nearly mirror-polished surface is formed on the metal plate 35 corresponding to the metal frame forming area A.

Next, the step shown in FIG. 5F punches the unnecessary metal plate part 35B to form the housing part 28 in the metal frame forming area A of the metal plate 35 by pressing the metal plate 35 while using a lower die 41 including an opening 41A where some of the protruding parts 43 of an upper die 42 are inserted and the upper die 42 including a plurality of protruding parts 43 (housing forming step). The protruding parts 43 correspond to the shapes of the housing part 28 and the opening 41A. With this housing part forming step, a structure corresponding to the metal frame 15 is formed in the metal frame forming area A of the metal plate 35 (refer to FIG. 6C).

In this way, by pressing the metal plate 35 to form the housing part 28, it is possible to finish the side face 28A of the housing part 28 functioning as a reflector into an almost mirror-polished surface. This enhances the light-emitting efficiency of the light-emitting device 10.

By forming the housing part 28 through two steps of press working, it is possible to enhance the flatness of the side face 28A of the housing part 28 compared with a case where the housing part 28 is formed through a single step of press working.

The step shown in FIG. 5G cuts part of the metal plate part 35 corresponding to the metal frame forming area A (part where a structure corresponding to the metal frame 15 is formed) by pressing the metal plate 35 while using a lower die 45 including an opening 45A where some of the protruding parts 47 of an upper die 46 are inserted and the upper die 46 including a plurality of protruding parts 47 corresponding to the shape of the opening 45A. This makes the metal frame 15 into individual pieces thus manufacturing a plurality of metal frames 15.

In this way, by cutting the metal plate 35 corresponding to the metal frame forming area A by way of press working to manufacture a plurality of metal frames 15, it is possible to form the housing part 28 and make the metal frame 15 into individual pieces on the same press working machine tool. This reduces the manufacturing costs of the metal frame 15 compared with a case where a method other than press working such as use of a dicer is employed to cut the metal frame 15 and make the metal frame 15 Into individual pieces.

Figure 5H:
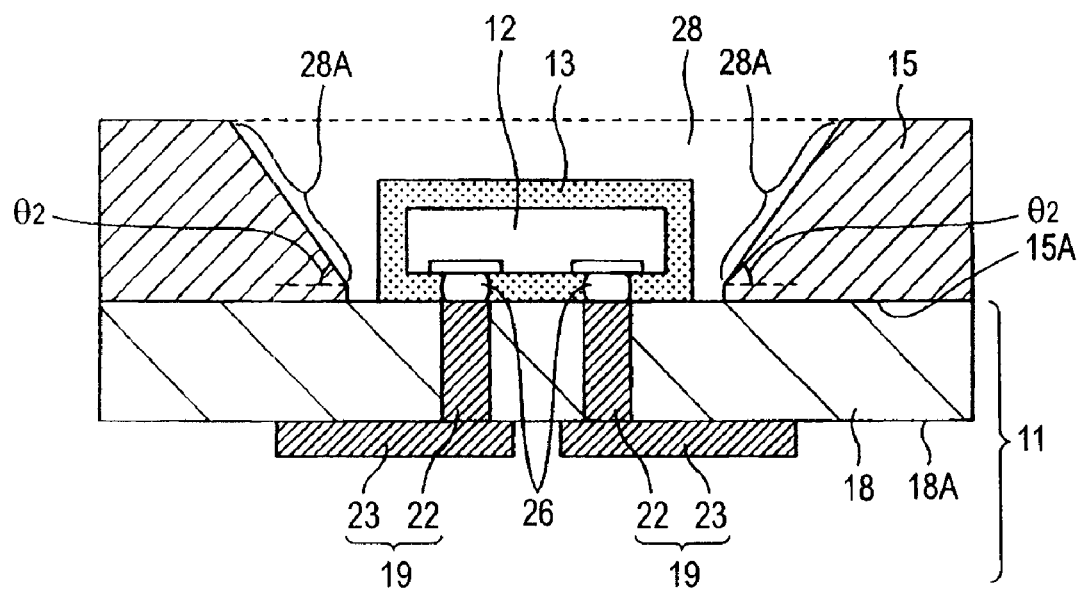
FIG. 5H shows a step of manufacturing a light-emitting device according to the first embodiment of the invention.

Next, the step shown in FIG. 5H uses an adhesive (not shown) to fix the metal frame 15 on the structure shown in FIG. 5C. The step shown in FIG. 5I fills the housing part 28 with a sealing resin 16 to seal the light-emitting element 12 covered with a phosphor-containing resin 13. This produces a light-emitting device 10. For example, a silicone resin may be used as the sealing resin 16.

With the method for manufacturing a light-emitting device according to this embodiment, it is possible to finish the side face 28A of the housing part 28 functioning as a reflector into an almost mirror-polished surface by pressing the metal plate 35 to form the housing part 28. This enhances the light-emitting efficiency of the light-emitting device 10.

By forming the housing part 28 and make the metal frame 15 into individual pieces by way of press working, it is possible to reduce the manufacturing costs of the light-emitting device 10 (manufacturing costs of the metal frame 15) compared with a case where a method other than press working such as use of a dicer is employed to cut the metal frame 15 into individual pieces.

While in the method for manufacturing the light-emitting device 10 according to this embodiment, the light-emitting element 12 is mounted on the substrate 11, the light-emitting element 12 is covered with the phosphor-containing resin 13, the metal frame 15 is fixed to the substrate 11, and the light-emitting element 12 covered with the phosphor-containing resin 13 is sealed with the sealing resin 16 as a non-limiting example, another procedure is available where the metal frame 15 is fixed to the substrate 11, the light-emitting element 12 is mounted on the substrate 11, the light-emitting element 12 is covered with the phosphor-containing resin 13, and the light-emitting element 12 covered with the phosphor-containing resin 13 is sealed with the sealing resin 16.

Second Embodiment

Figure 7:
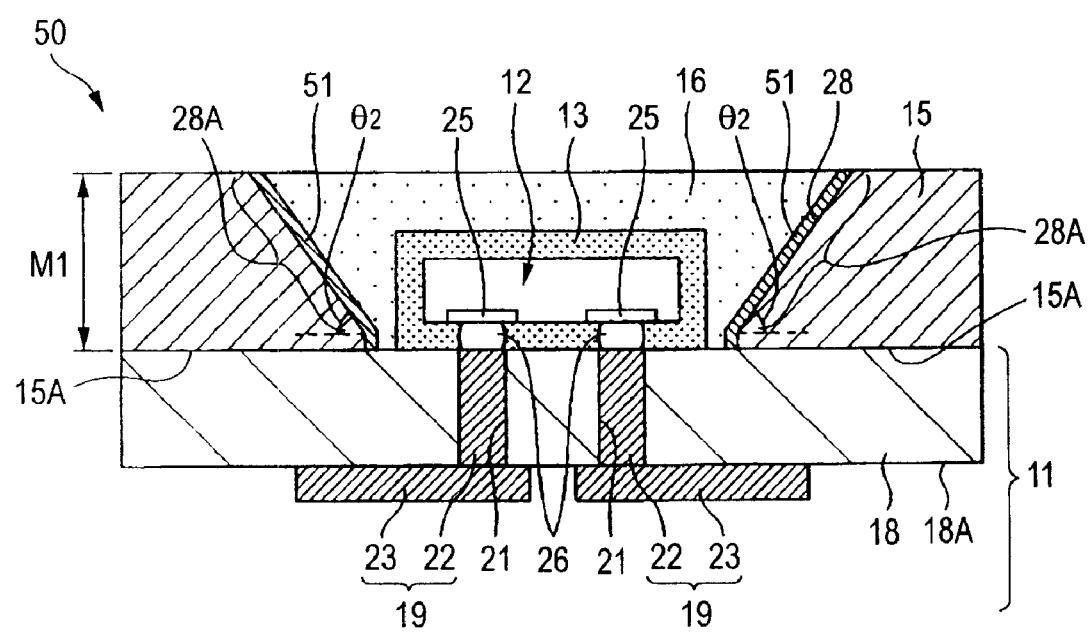
FIG. 7 is a cross-sectional view of a light-emitting device according to the second embodiment of the invention.

FIG. 7 is a cross-sectional view of a light-emitting device according to the second embodiment of the invention. In FIG. 7, a same component as that of the light-emitting device 10 according to the first embodiment of the invention is given a same sign.

Referring to FIG. 7, a light-emitting device 50 according to the second embodiment is the same as the light-emitting device 10 except that a reflecting member 51 is added to the configuration of the light-emitting device 10 according to first embodiment.

The reflecting member 51 is provided so as to cover the side face 28A of a housing part 28. The reflecting member 51 is intended to efficiently reflect the light emitted by the light-emitting element 12. As the reflecting member 51, for example, a metal film or a conductor paste including a solvent where a metal particles are dispersed may be used. As a material for a metal film, at least one metal out of for example Au, Ag, Al, Ni, Pd and Pt may be used. A metal film may be formed by way of the plating method, vapor deposition method, sputtering method or the like.

A solvent in a conductor paste may be for example water or an organic solvent containing or not containing glycerin. As an organic solvent, for example, alcohol, ether, xylene, or toluene may be used. Metal particles in the conductor paste may be particles including at least one of the metals such as Au, Ag, Al, Ni, Pd and Pt. The conductor paste may be formed by way of the spray coat method, inkjet method, or dispensing method.

With the light-emitting device according to this embodiment, it is possible to efficiently reflect the light emitted from the light-emitting element 12 by providing the reflecting member 51 on the side face 28A of the housing part 28. This enhances the light-emitting efficiency of the light-emitting device 50.

The light-emitting device 50 according to the second embodiment can be manufactured with the same procedure as that for the light-emitting device 10 according to the first embodiment except that a reflecting member forming step of forming the reflecting member 51 is provided between the step (housing part forming step) shown in FIG. 5F and the step shown in FIG. 5G.

Figure 8:
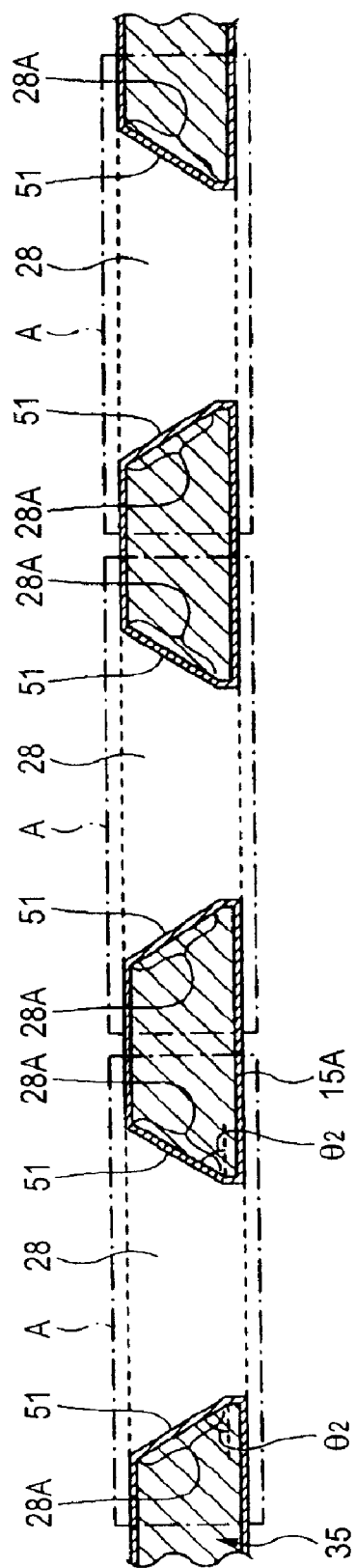
FIG. 8 shows a step of manufacturing the light-emitting device according to the second embodiment of the invention.

FIG. 8 shows a step of manufacturing the light-emitting device according to the second embodiment of the invention. In FIG. 8, a same component as that of the light-emitting device 10 according to the first embodiment of the invention is given a same sign. In the example shown in FIG. 8, the reflecting member 51 is formed by way of the electroplating method.

The reflecting member forming step will be described referring to FIG. 8. As shown in FIG. 8, a metal film is deposited and grown on the surfaces of the metal plate 35 (including the side face 28A of the housing part 28) by way of the electroplating method that uses as a power feed layer the metal plate 35 where a plurality of housing parts 28 are formed. This forms the reflecting member 51.

In this way, by simultaneously forming the reflecting member 51 on the side faces 28A of the plurality of housing parts 28 provided on the metal plate 35, it is possible to enhance the productivity of the light-emitting device 50 compared with a case where the reflecting member 51 is formed on the side face 28A of each metal frame 15 as an individual piece.

A metal film working as the reflecting member 51 may be formed by way of a method other than the plating method, such as vapor deposition method or sputtering method. The conductor paste described earlier may be formed as the reflecting member 51 on each of the side faces 28A of the plurality of housing parts 28 by way of the inkjet method or dispensing method.

Figure 5I:
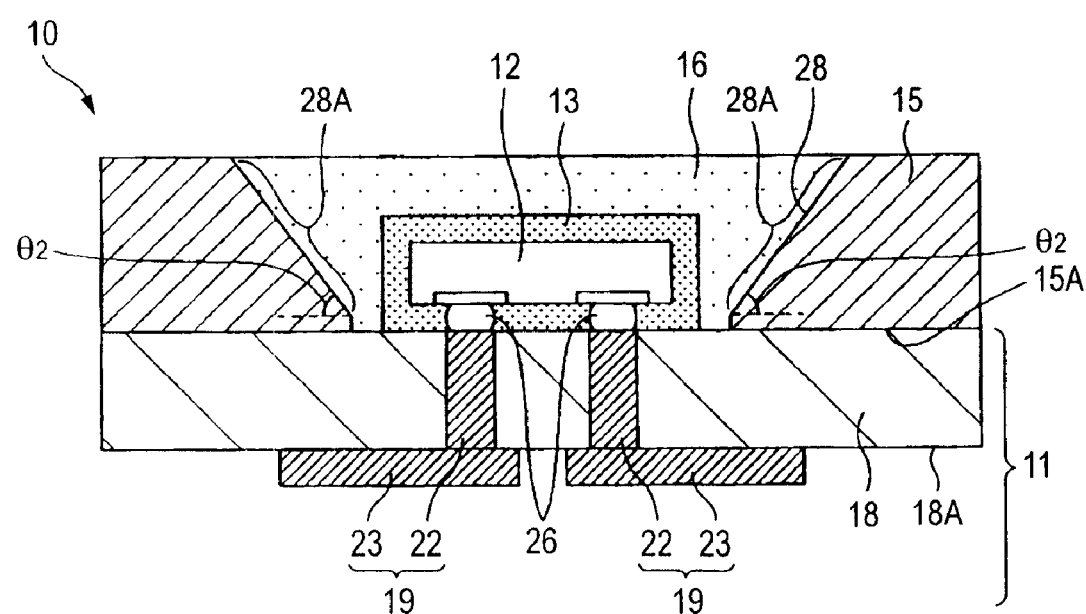
FIG. 5I shows a step of manufacturing a light-emitting device according to the first embodiment of the invention.

After the reflecting member forming step, a plurality of light-emitting devices 50 are manufactured by performing the same steps as those shown in FIGS. 5G to 5I.

According to the method for manufacturing the light-emitting device of this embodiment, by simultaneously forming the reflecting member 51 on the side faces 28A of the plurality of housing parts 28 provided on the metal plate 35, it is possible to enhance the productivity of the light-emitting device 50 compared with a case where the reflecting member 51 is formed on the side face 28A of each metal frame 15 as an individual piece.

The light-emitting device 50 according to this embodiment may be manufactured by fixing the metal frame 15 including the reflecting member 51 to the substrate 11, mounting the light-emitting element 12 on the substrate 11, covering the light-emitting element 12 is with the phosphor-containing resin 13, and sealing the light-emitting element 12 covered with the phosphor-containing resin 13 by using the sealing resin 16.

Third Embodiment

Figure 9:
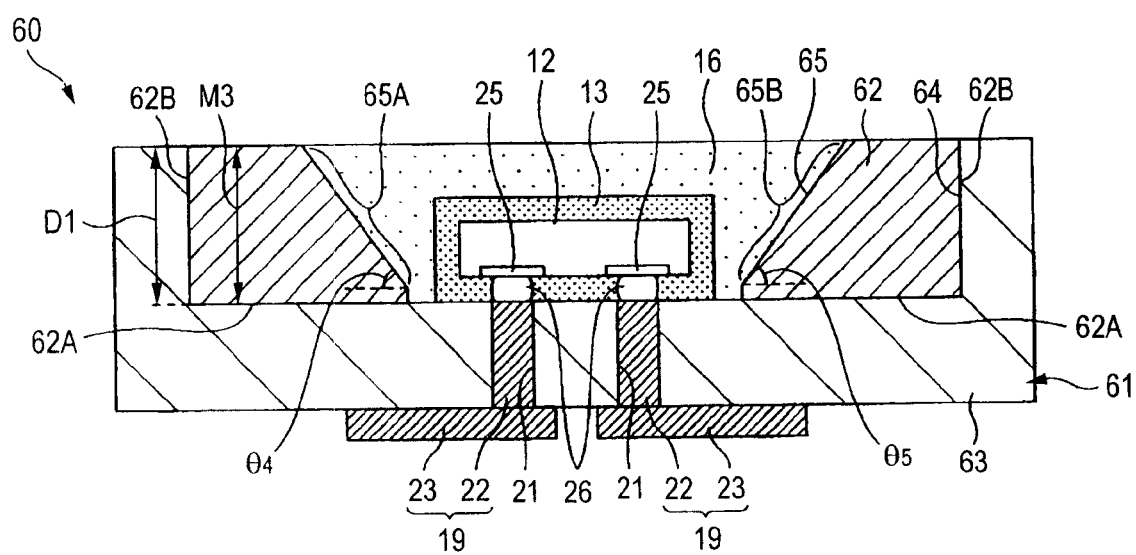
FIG. 9 is a cross-sectional view of a light-emitting device according to the third embodiment of the invention.
Figure 10:
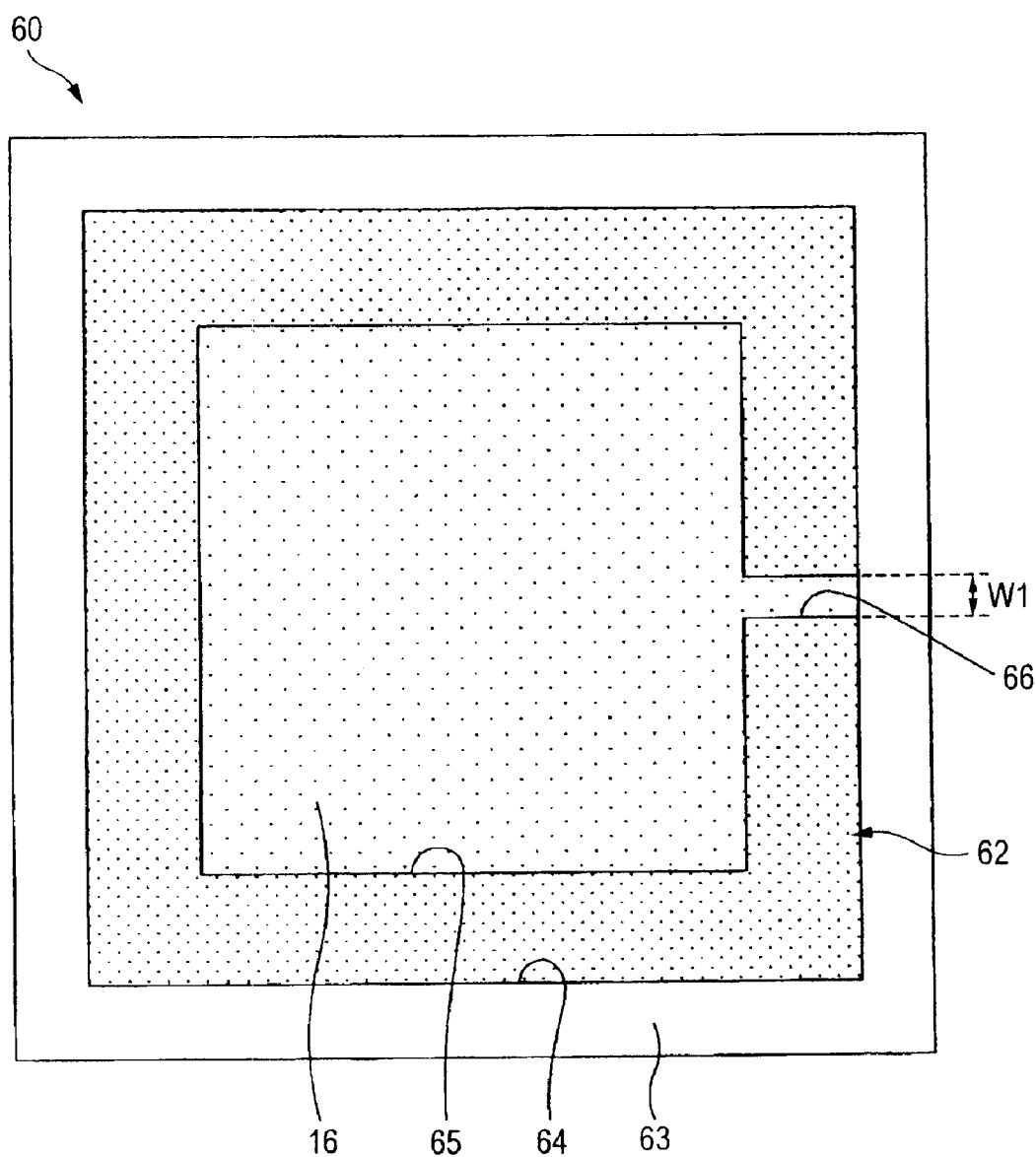
FIG. 10 is a plan view of the light-emitting device according to the third embodiment of the invention.

FIG. 9 is a cross-sectional view of a light-emitting device according to the third embodiment of the invention. FIG. 10 is a plan view of the light-emitting device according to the third embodiment of the invention. In FIGS. 9 and 10, a same component as that of the light-emitting device 10 according to the first embodiment of the invention is given a same sign. In FIG. 9, θ4 represents the inclination angle of the side face 65A of a housing part 65 with respect to the bottom face 62A of a metal frame 62 (hereinafter referred to as the "inclination angle θ4"). θ5 represents the inclination angle of the side face 65B of the housing part 65 with respect to the bottom face 62A of the metal frame 62 (hereinafter referred to as the "inclination angle θ5").

Referring to FIGS. 9 and 10, a light-emitting device 60 according to the third embodiment is the same as the light-emitting device 10 except that a substrate 61 and a metal frame 62 are provided in place of the substrate 11 and the metal frame 15 provided in the light-emitting device 10 according to the first embodiment.

The substrate 61 includes a substrate main body 63 and a wiring pattern 19 including vias 22 and wiring 23. The substrate main body 63 includes a plurality of through holes 21 and a metal frame inserting part 64. The metal frame inserting part 64 is a recessed portion into which the metal frame 62 is inserted. The metal frame inserting part 64 is in contact with the bottom face 62A. The depth D1 of the outer peripheral surface 62B of the metal frame inserting part 64 is approximately equal to the thickness M3 of the metal frame 62. A material for the substrate main body 63 may be for example a resin, ceramic, glass, or silicon. In case silicon is used as a material for the substrate main body 63, an insulating layer (not shown) is provided between the substrate main body 63 and the wiring pattern 19.

Figure 11:
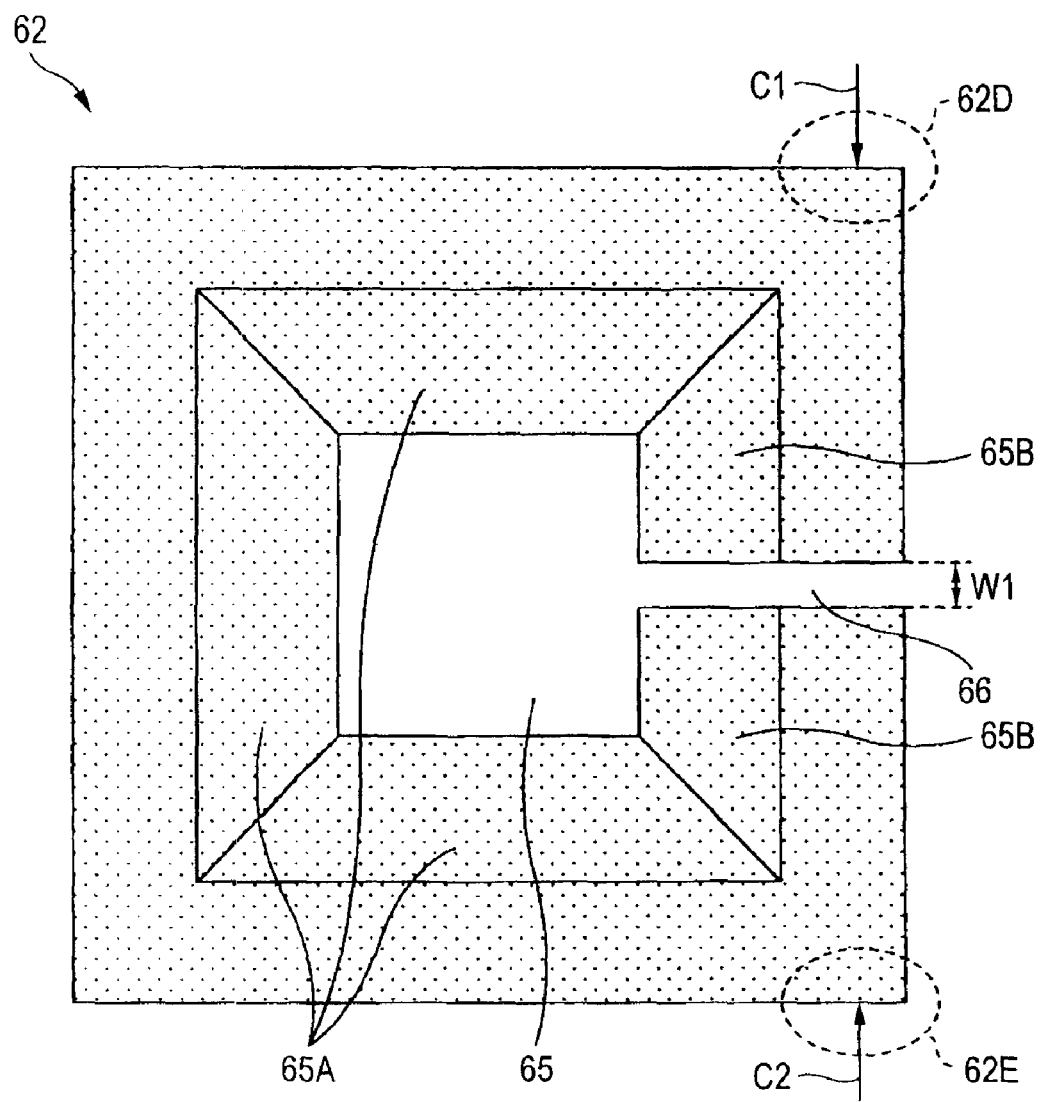
FIG. 11 is a plan view of a metal frame.

FIG. 11 is a plan view of a metal frame.

Referring to FIGS. 9 and 11, the metal frame 62 is separately formed from the substrate 61 and provided at the metal frame housing part 64 formed on the substrate 61. The metal frame 62 has a shape of a frame surrounding the light-emitting element 12 and includes a housing part 65 and a cutting part 66.

The housing part 65 has a shape that is tapered upward from the substrate 61. The housing part 65 is intended to house the light-emitting element 12. The lower end of the housing part 65 has a quadrangular shape and the upper end of the housing part 65 is a quadrangle that is larger than the lower end of the housing part 65.

The side faces 65A, 65B of the housing part 65 are provided to sur round the light-emitting element 12. The side faces 65A, 65B of the housing part 65 are mirror-polished. The side face 65A of the housing part 65 is an inclined surface forming the inclination angle θ4 with respect to the bottom face 62A of the metal frame 62. The side face 65B of the housing part 65 is an inclined surface forming the inclination angle θ5 with respect to the bottom face 62A of the metal frame 62. The inclination angle θ5 is approximately equal to the inclination angle θ4. The side faces 65A, 65B of the housing part 65 function as reflectors for reflecting light emitted from the light-emitting element 12.

The inclination angles θ4, θ5 are angles that allow light to be reflected in a desired direction. The inclination angles θ4, θ5 may be set for example within the range of 45 to 55 degrees. The housing part 65 may be formed for example through press working of a metal plate.

For example, one or more types of metal out of Cu, Fe, Au, Ag, Al, Ni, Pd and Pt may be used as a material for the metal frame 62. In particular, a Cu alloy or an Fe—Ni alloy is preferable as a material for the metal frame 62. In case the light-emitting element 12 is 80 micrometers thick, the thickness M3 of the metal frame 62 may be for example 120 micrometers.

As described above, by separately forming the metal frame 62 and the substrate 61, it is possible to provide at the metal frame inserting part 64 of the substrate 61 the metal frame 62 including the side faces 65A, 65B (faces functioning as reflectors) of the housing part 65 made into an almost mirror-polished surface. This enhances the light-emitting efficiency of the light-emitting device 60.

By separately forming the metal frame 62 and the substrate 61, the metal frame 62 can be replaced with another on the substrate 61. This makes it possible to readily change the inclination angles θ4, θ5 of the side faces 65A, 65B of the housing part 65.

When the metal frame 62 is replaced with another metal frame, it is not necessary to change the configuration of the substrate 61. This reduces the costs of the light-emitting device 60 compared with the related art light-emitting device 100 including the substrate 101 with the housing part 109 arranged thereon.

A cutting part 66 is provided so as to cut the metal frame 62 positioned between two side faces 65B of the housing part 65. The metal frame 62 thus has a shape of a frame including a gap part. The cutting part 66 of the metal frame 62 inserted into the metal frame inserting part 64 is filled with a sealing resin 16. The width W1 of the cutting part 66 may be for example 0.1 mm.

By providing such a cutting part 66 on the metal frame 62, it is possible to press the corner parts 62D, 62E of the metal frame 62 in C1 and C2 directions to deform the external shape of the metal frame 62. This allows the metal frame 62 to be attached to the metal frame inserting part 64 without using an adhesive.

According to the light-emitting device of this embodiment, by separately forming the metal frame 62 and the substrate 61, it is possible to provide at the metal frame inserting part 64 of the substrate 61 the metal frame 62 including the side faces 65A, 65B (faces functioning as reflectors) of the housing part 65 made into an almost mirror-polished surface. This enhances the light-emitting efficiency of the light-emitting device 60.

By separately forming the metal frame 62 and the substrate 61, the metal frame 62 can be replaced with another on the substrate 61. This makes it possible to readily change the inclination angles θ4, θ5 of the side faces 65A, 65B of the housing part 65.

By providing the cutting part 66 on the metal frame 62, it is possible to deform the external shape of the metal frame 62. This allows the metal frame 62 to be attached to the metal frame inserting part 64 without using an adhesive. The outer peripheral surface 62B of the metal frame 62 is pressed against the metal frame inserting part 64 by way of the elastic force of the metal frame 62. This attaches the metal frame 62 to the metal frame inserting part 64 of the substrate main body 63.

The light-emitting device 60 according to this embodiment may include a reflecting member 51 described in the second embodiment on the side faces 65A, 65B of the housing part 65.

Figure 12:
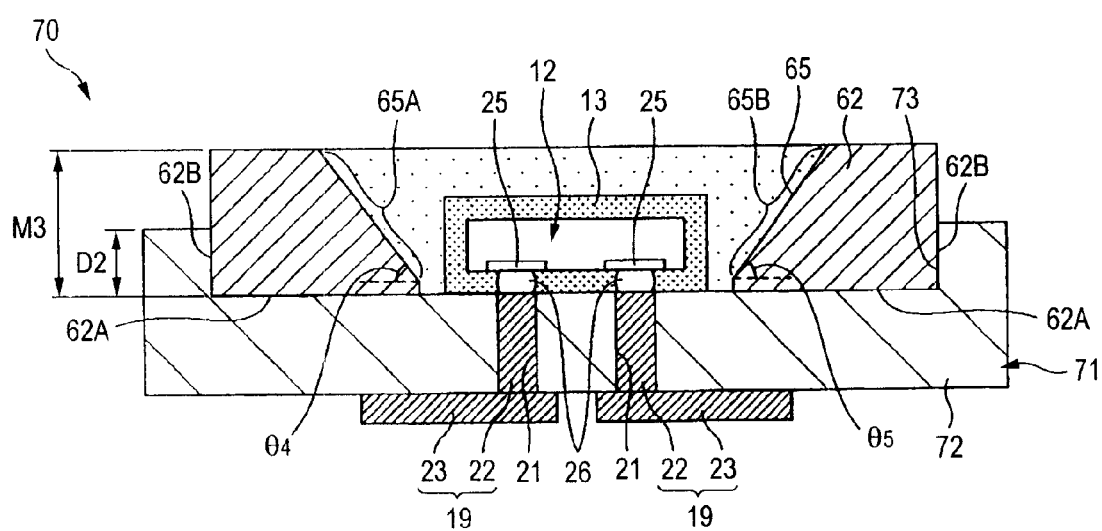
FIG. 12 is a cross-sectional view of a light-emitting device according to a variation of the third embodiment.

FIG. 12 is a cross-sectional view of a light-emitting device according to a variation of the third embodiment. In FIG. 12, a same component as that of the light-emitting device 60 according to the third embodiment is given a same sign.

Referring to FIG. 12, a light-emitting device 70 according to a variation of the third embodiment has the same configuration as the light-emitting device 60 except that a substrate 71 is provided in place of the substrate 61 provided in the light-emitting device 60 of the third embodiment.

The substrate 71 includes a substrate main body 72 and a wiring pattern 19 including vias 22 and wiring 23. The substrate main body 72 includes a plurality of through holes 21 and a metal frame inserting part 73. The metal frame inserting part 73 is a recessed part for inserting at least part of the metal frame 62. The depth D2 of the metal frame inserting part 73 is smaller than the thickness M3 of the metal frame 62 (D2<M3). A material for the substrate main body 72 may be for example a resin, ceramic, glass, or silicon. In case silicon is used as a material for the substrate main body 72, an insulating layer (not shown) is provided between the substrate main body 72 and the wiring pattern 19.

The light-emitting device 70 including the substrate 71 with the metal frame inserting part 73 arranged thereon has the same advantage as that of the light-emitting device 60 of the third embodiment. A metal frame applicable to the light-emitting device 70 only needs to include the side face of a housing part made into an almost mirror-polished surface and a single cutting part and is not limited to the shape of the metal frame 62. For example, a metal frame 75 shown in FIG. 13 described later is applicable.

Figure 13:
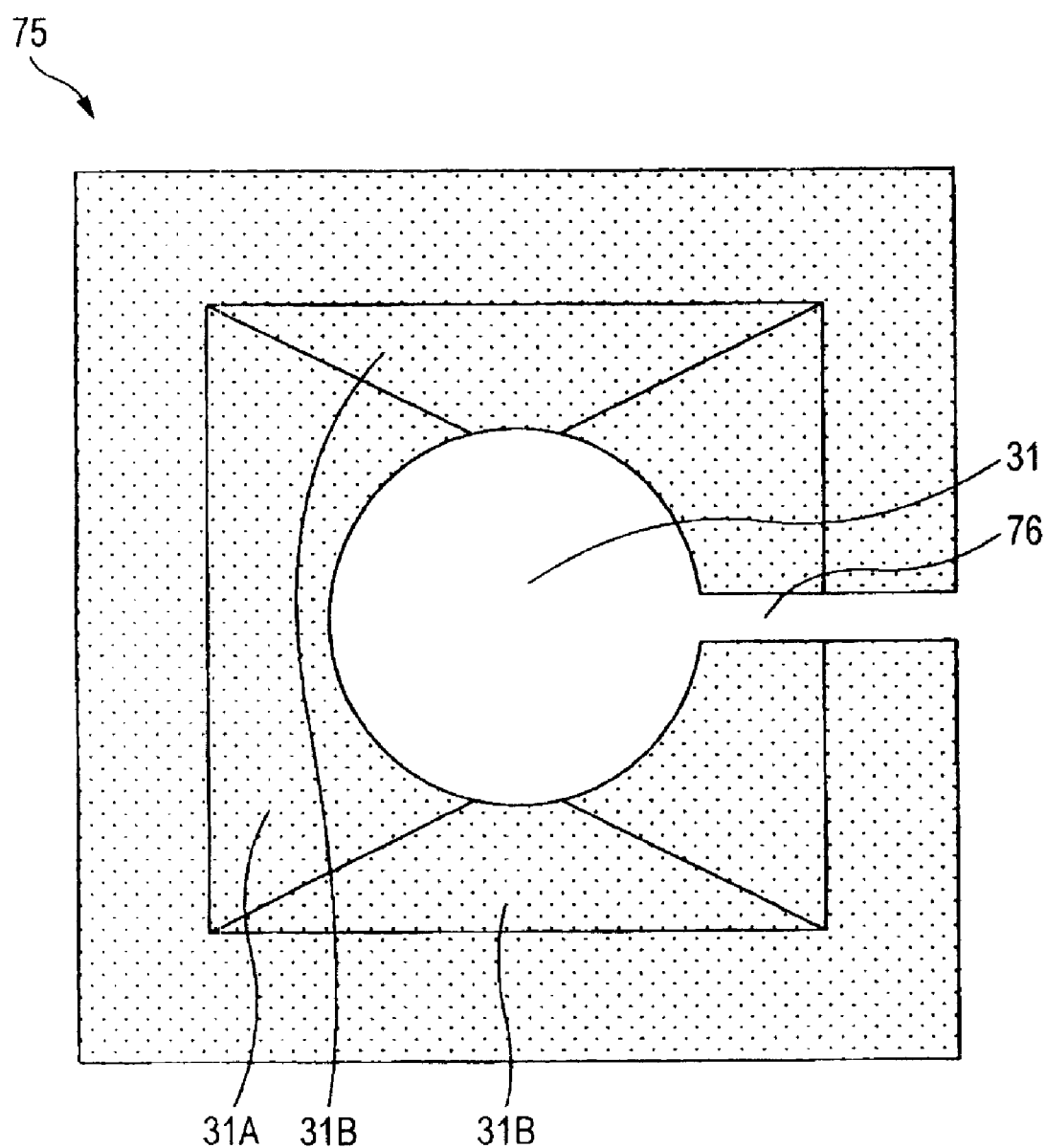
FIG. 13 is a plan view of another metal frame including a cutting part.

FIG. 13 is a plan view of another metal frame including a cutting part. In FIG. 13, a same component as that of the metal frame 30 shown in FIG. 4 is given a same sign.

Referring to FIG. 13, a metal frame 75 has the same configuration as the metal frame 30 except that a cutting part 76 is added to the metal frame 30 shown in FIG. 4. The cutting part 76 is formed so as to cut part of the metal frame 75.

Even in case the metal frame 75 of the above configuration is provided in place of the metal frame 62 arranged in the light-emitting device 60 or 70, it is possible to obtain the same advantage as that of the light-emitting device 60 or 70.

The reflecting member described in the second embodiment may be provided on the side faces 31A, 31B of the housing part 31 of the metal frame 75.

The light-emitting device 60 according to the third embodiment can be manufactured with the same procedure as that for the light-emitting device 10 according to the first embodiment except that a cutting part forming step of forming the cutting part 66 is provided between the step (housing part forming step) shown in FIG. 5F and the step shown in FIG. 5G.

Figure 14:
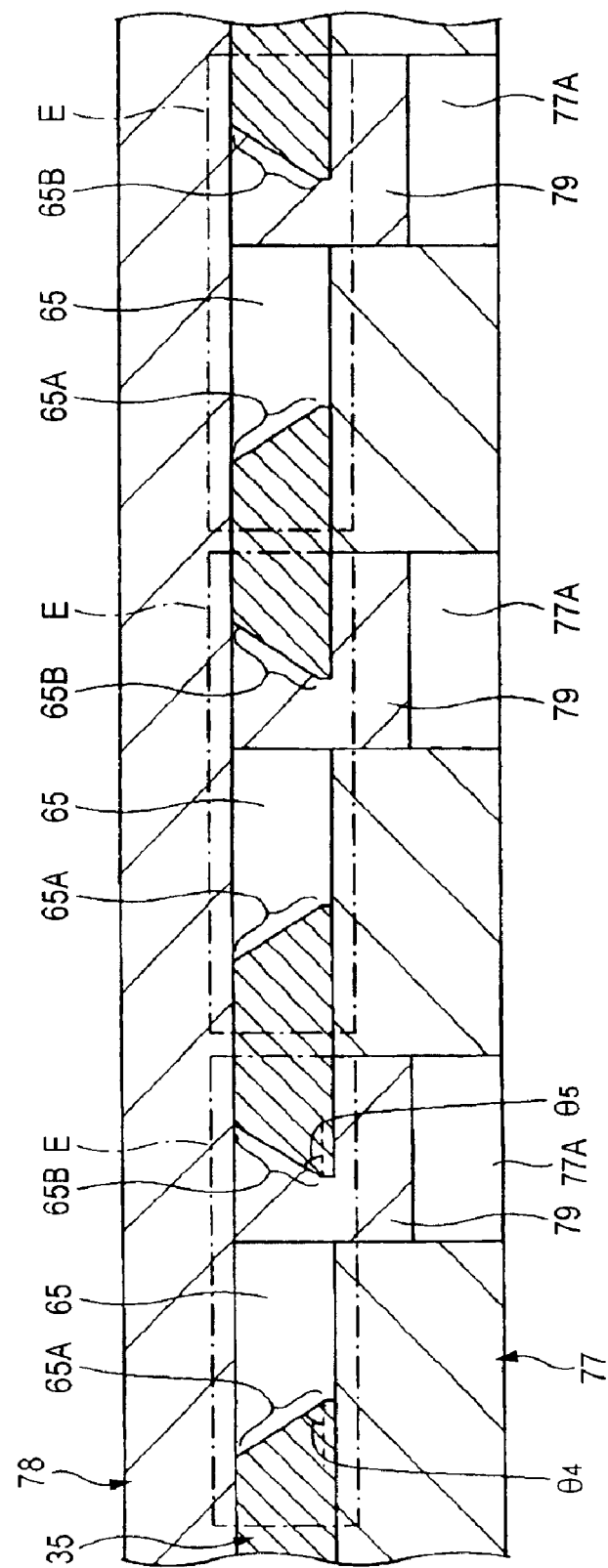
FIG. 14 shows a step of manufacturing the light-emitting device according to the third embodiment of the invention.
Figure 15:
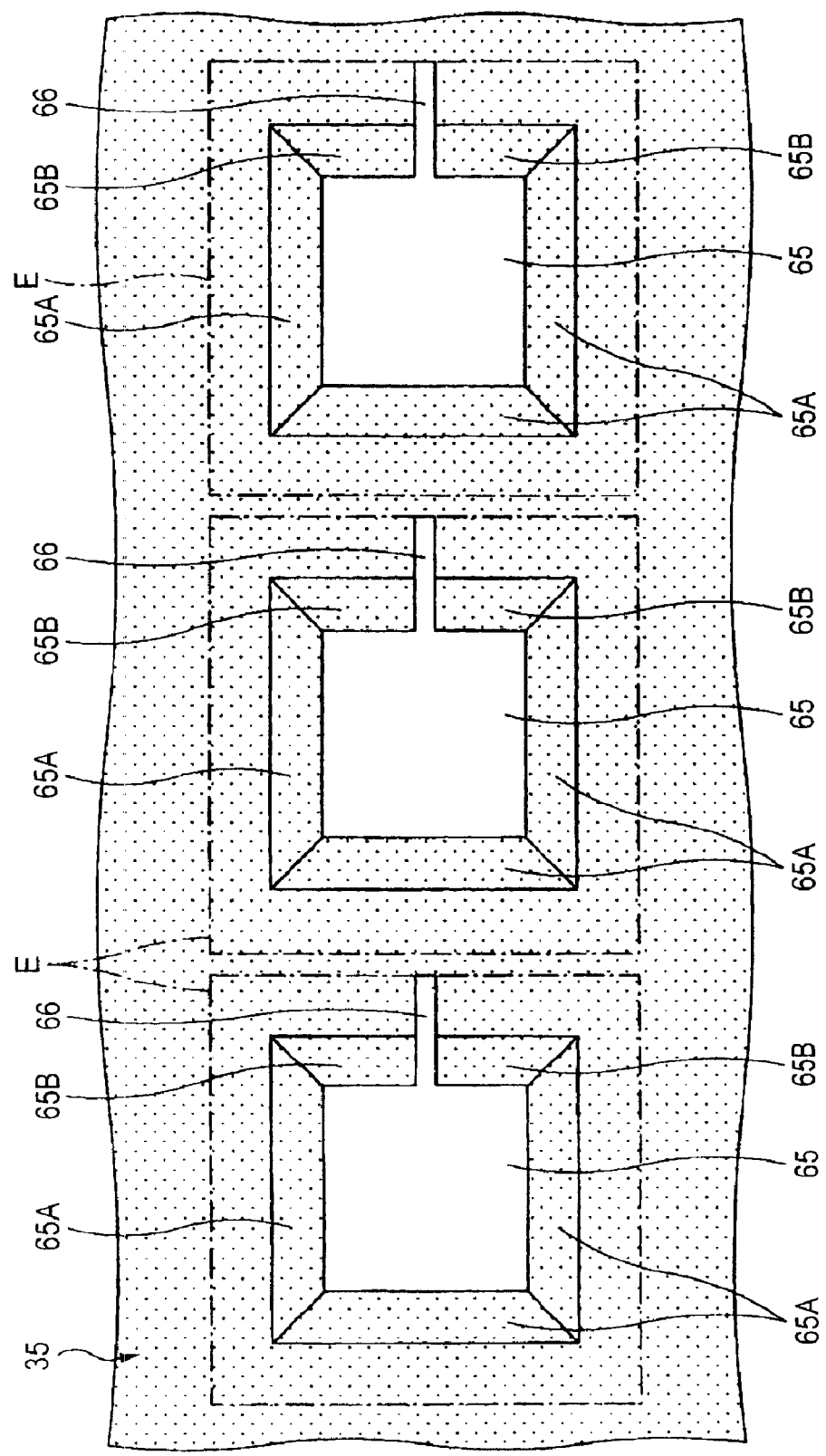
FIG. 15 is a plan view of the metal plate shown in FIG. 14.

FIG. 14 shows a step of manufacturing the light-emitting device according to the third embodiment of the invention. In FIGS. 14 and 15, a same component as that of the light-emitting device 60 according to the third embodiment is given a same sign. A sign E shown in FIGS. 14 and 15 represents the area of the metal plate 35 where the metal frame 62 is formed (hereinafter referred to as the "metal frame forming area E").

The cutting part forming step will be described referring to FIG. 14.

As shown in FIG. 14, by way of press working that uses a lower die 77 including an opening 77A where some of the protruding parts 79 of an upper die 78 are inserted and the upper die 78 including a plurality of protruding parts 79 corresponding to the shape of the cutting part 66, the cutting part 66 is formed in the metal frame forming area E of the metal plate 35 where a housing part 65 is formed (refer to FIG. 15). This forms a structure corresponding to the metal frame 62 in the metal frame forming area E of the metal plate 35.

In this way, by forming on the metal frame 62 the cutting part 66 that allows the external shape of the metal frame 62 to be deformed, it is possible to attach the metal frame 62 to the metal frame inserting part 64 of the substrate 61 without using an adhesive.

By separately performing press working for forming the housing part 65 and press working for forming the cutting part 66, is possible to enhance the flatness of the side faces 65A, 65B of the housing part 65 compared with a case where the housing part 65 and the cutting part 66 are formed in a single process of press working.

After the cutting member forming step, a plurality of light-emitting devices 60 are manufactured by performing the same steps as those shown in FIGS. 5G to 5I explained in the first embodiment.

According to the method for manufacturing the light-emitting device of this embodiment, it is possible to finish the side faces 65A, 65B of the housing part 65 functioning as reflectors into almost mirror-polished surfaces by forming the housing part 65 on the metal plate 35 by way of press working. This enhances the light-emitting efficiency of the light-emitting device 60.

By forming on the metal frame 62 the cutting part 66 that allows the external shape of the metal frame 62 to be deformed, it is possible to attach the metal frame 62 to the metal frame inserting part 64 of the substrate 61 without using an adhesive.

By separately performing press working for forming the housing part 65 and press working for forming the cutting part 66, it is possible to enhance the flatness of the side faces 65A, 65B of the housing part 65.

The light-emitting device 60 according to this embodiment may be manufactured by attaching the metal frame 62 to the metal frame inserting part 64 of the substrate 61, mounting the light-emitting element 12 on the substrate 61, covering the light-emitting element 12 is with the phosphor-containing resin 13, and sealing the light-emitting element 12 covered with the phosphor-containing resin 13 by using the sealing resin 16. The light-emitting device 70 according to the variation of the third embodiment can be produced in a similar manner as that of the light-emitting device 60.

Fourth Embodiment

Figure 16:
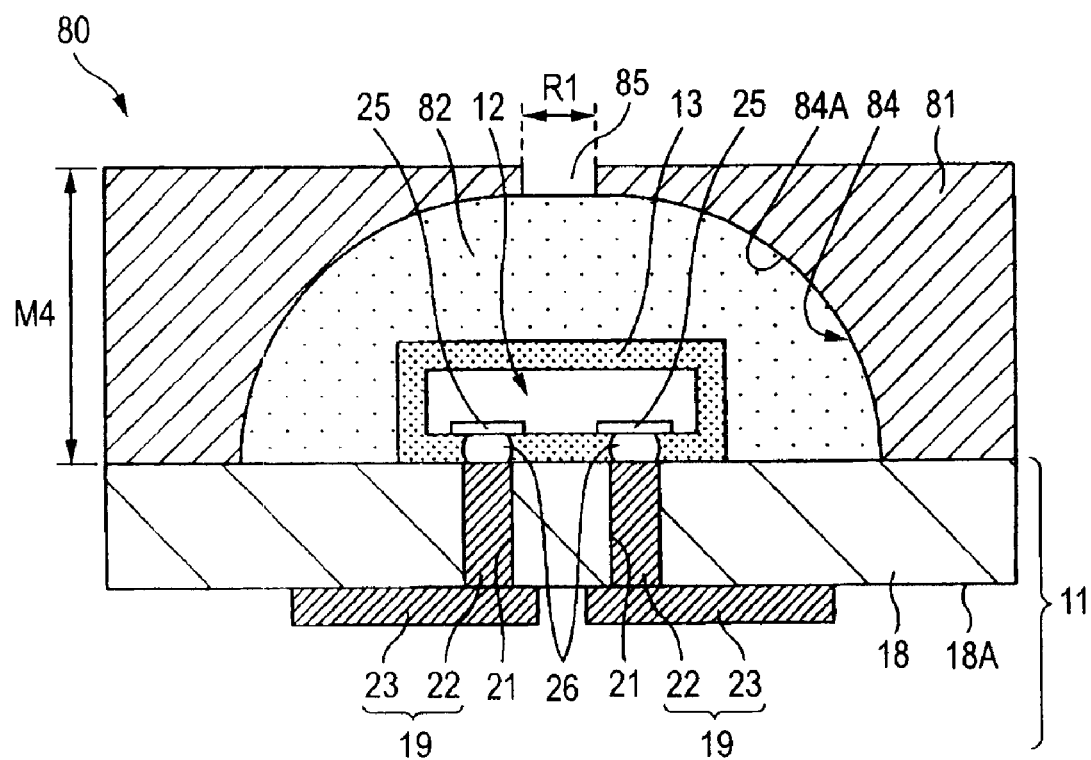
FIG. 16 is a cross-sectional view of a light-emitting device according to the fourth embodiment of the invention.
Figure 17:
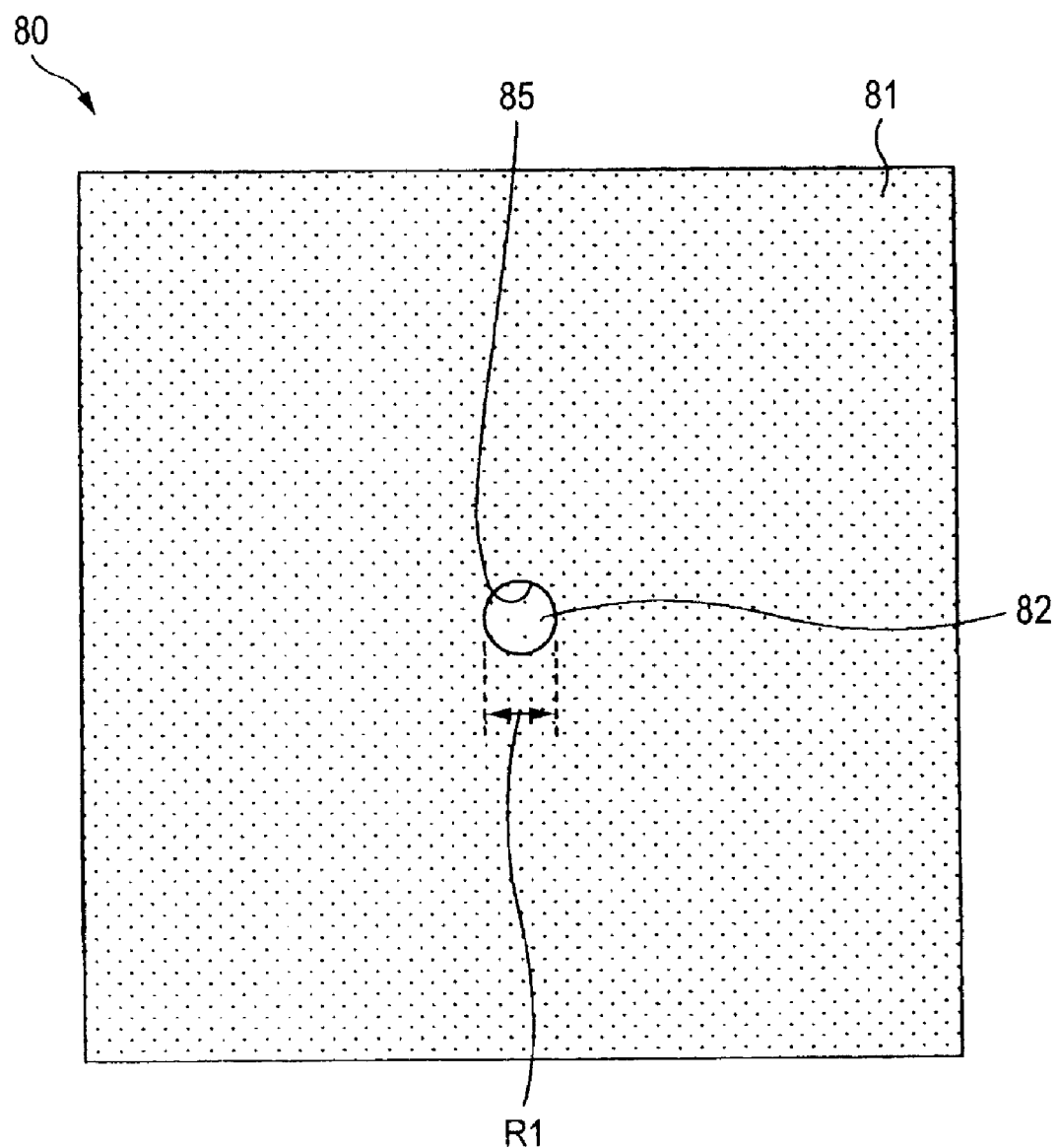
FIG. 17 is a plan view of the light-emitting device according to the fourth embodiment of the invention.
Figure 18:
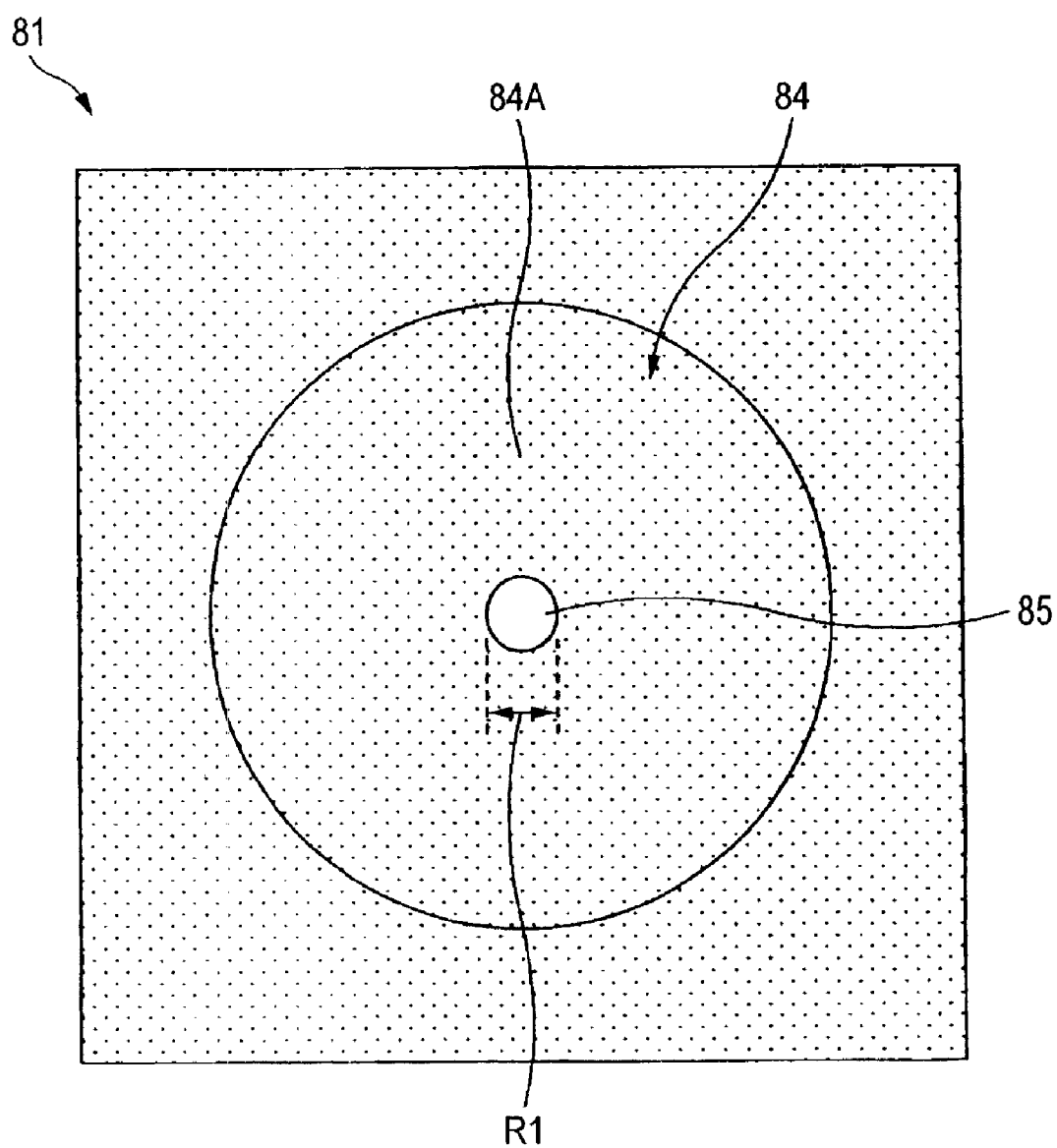
FIG. 18 is a plan view of a metal cover.

FIG. 16 is a cross-sectional view of a light-emitting device according to the fourth embodiment of the invention. FIG. 17 is a plan view of the light-emitting device according to the fourth embodiment of the invention. FIG. 18 is a plan view of a metal cover. In FIG. 16, a same component as that of the light-emitting device 10 according to the first embodiment of the invention is given a same sign. M4 shown in FIG. 16 represents the thickness (hereinafter referred to as the "thickness M4") of a metal cover 81 at a portion that comes into contact with the substrate main body 18.

Referring to FIGS. 16 to 18, a light-emitting device 80 according to the fourth embodiment has the same configuration as the light-emitting device 10 except that a metal cover 81 and a sealing resin 82 are provided in place of the metal frame 15 and the sealing resin 16 provided in the light-emitting device 10 according to the first embodiment.

The metal cover 81 is provided on the substrate 11. The metal cover 81 includes a housing part 84 and through holes 85. The housing part 84 is provided on the metal cover 81 on the side that comes into contact with the substrate 11. The housing part 84 is intended to house the light-emitting element 12 covered with the phosphor-containing resin 13. The housing part 84 has a shape of a dome. The face 84A of the housing part 84 is an almost mirror-polished surface and functions as a reflector for reflecting light from the light-emitting element 12. The housing part 84 is formed for example by pressing a metal plate.

The through holes 85 are formed so as to penetrate the metal cover 81 corresponding to the position where the housing part 84 is formed. The through holes 85 are intended to emit to outside the metal cover 81 the light emitted from the light-emitting element 12. The through holes 85 are formed for example by pressing a metal plate where the housing part 84 is formed. The diameter R1 of the through hole 85 is for example 1 mm.

A material for the metal cover 81 may be for example at least one of the metals such as Cu, Fe, Au, Ag, Al, Ni, Pd and Pt. In particular, a Cu alloy or an Fe—Ni alloy is preferable as a material for the metal cover 81. In case the light-emitting element 12 is 80 micrometers thick, the thickness M4 of the metal cover 81 may be for example 180 micrometers.

The sealing resin 82 is provided to fill the housing part 84. The sealing resin 82 is intended to seal the light-emitting element 12 covered with the phosphor-containing resin 13. For example, a silicone resin may be used as the sealing resin 82.

According to the light-emitting device of this embodiment, by separately forming the housing part 84 for housing the light-emitting element 12, the metal cover 81 including through holes 85 for transmitting light emitted from the light-emitting element 12 and the substrate 11, it is possible to provide on the substrate 11 the metal cover 81 having the face 84A of the housing part 84 made into an almost mirror-polished surface. This enhances the light-emitting efficiency of the light-emitting device 80.

By separately forming the metal cover 81 and the substrate 11, the metal cover 81 can be replaced with another on the substrate 11. This makes it possible to readily change the size of the diameter R1 of the through hole 85.

While the light-emitting device 80 according to this embodiment includes a sealing resin 82 as a non-limiting example, the sealing resin may be omitted. A light-emitting device that does not include the sealing resin 82 has the same advantage as that of the light-emitting device 80 according to this embodiment. The reflecting member 51 described in the second embodiment may be provided on the face 84A of the housing part 84. By providing the reflecting member 51 on the face 84A of the housing part 84, it is possible to enhance the light-emitting efficiency of the light-emitting device 80.

Figure 19B:
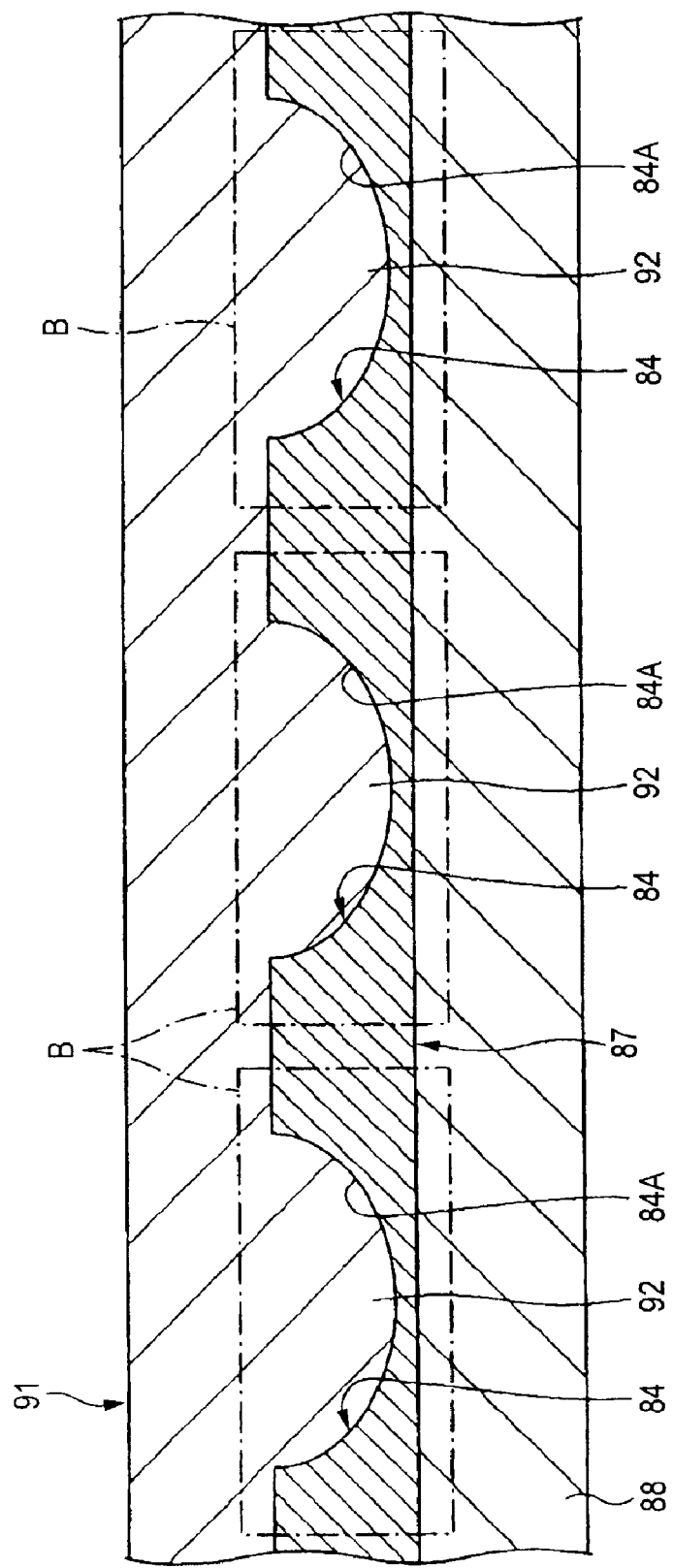
FIG. 19B shows a step of manufacturing a light-emitting device according to the fourth embodiment of the invention.

FIGS. 19A to 19F show steps of manufacturing the light-emitting device according to the fourth embodiment of the invention. In FIGS. 19A to 19F, a same component as that of the light-emitting device 80 according to the fourth embodiment is given a same sign. A sign B shown in FIGS. 19A to 19C represents the area of the metal plate 87 where the metal cover 81 is formed (hereinafter referred to as the "metal cover forming area B").

Figure 20C:
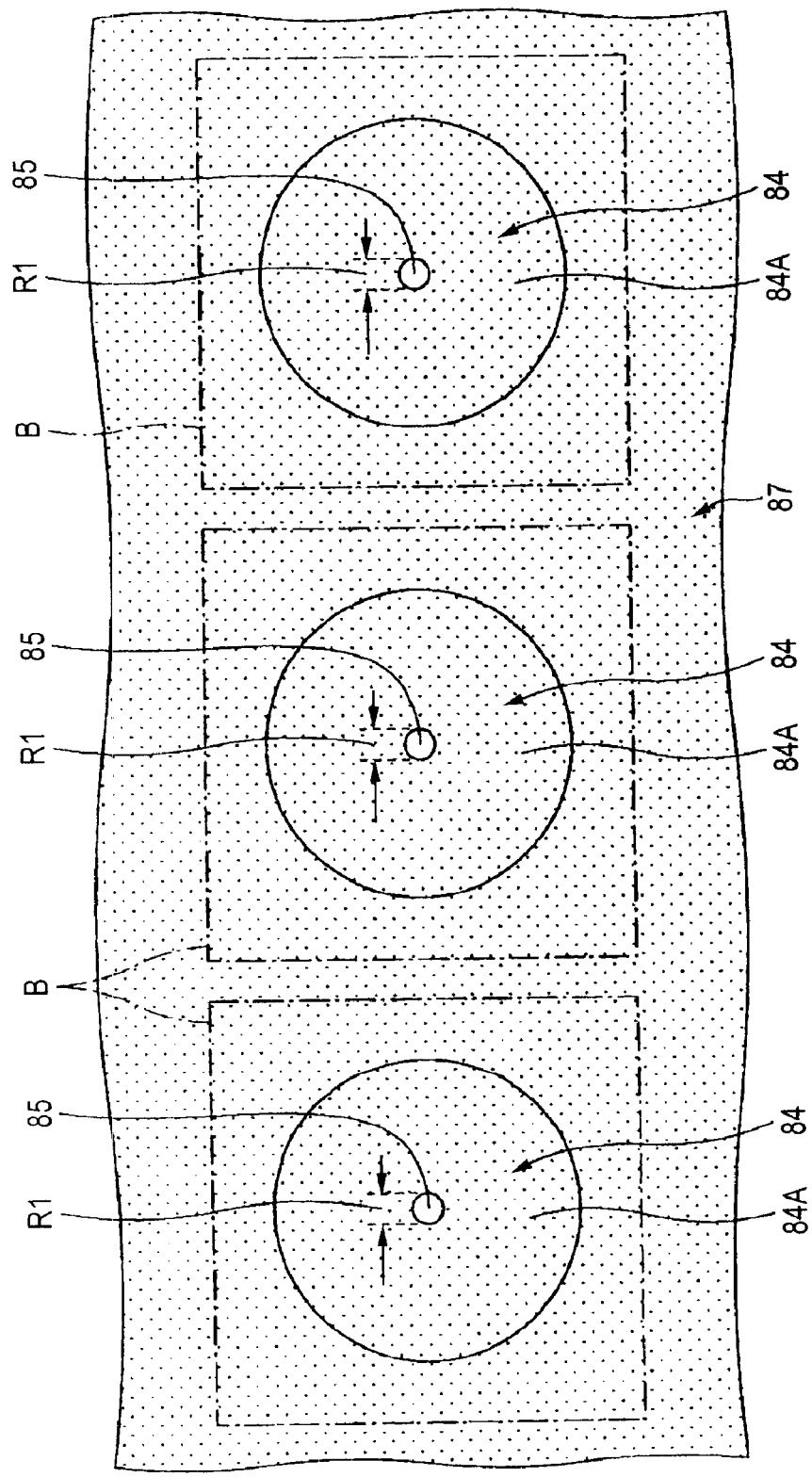
FIG. 20C is a plan view of the metal plate shown in FIG. 19C.

FIG. 20A is a plan view of the metal cover shown in FIG. 19A. FIG. 20B is a plan view of the metal plate shown in FIG. 19B. FIG. 20C is a plan view of the metal cover shown in FIG. 19C.

A method for manufacturing the light-emitting device 80 according to the fourth embodiment of the invention will be described referring to FIGS. 19A to 20C.

The step shown in FIG. 19A prepares a metal plate 87 including a plurality of metal cover 81 forming areas B (refer to FIG. 20A) (metal plate preparation step). For example, at least one of the metals including Cu, Fe, Au, Ag, Al, Ni, Pd and Pt may be used as a material for the metal plate 87. In particular, a Cu alloy or an Fe—Ni alloy is preferable as a material for the metal plate 87. The thickness M5 of the metal plate 87 is set so as to be approximately equal to the thickness M4 of the metal cover 81. To be more precise, in case the light-emitting element 12 is 80 micrometers thick, the thickness M5 of the metal plate 87 may be for example 180 micrometers.

The step shown in FIG. 19B forms the housing part 84 (refer to FIG. 20B) in the metal cover forming area B of the metal plate 87 by way of press working that uses a lower die 88 having a shape of a plate and an upper die 91 including a plurality of protruding parts 92 (housing part forming step). The protruding parts 92 correspond to the shape of the housing part 84.

In this way, by forming the housing part 84 on the metal plate 87 by way of press working that uses the lower die 88 and the upper die 91, it is possible to finish the face 84A of the housing part 84 functioning as a reflector into an almost mirror-polished surface. This enhances the light-emitting efficiency of the light-emitting device 80.

The step shown in FIG. 19C forms through holes 85 in the metal cover forming area B of the metal plate 87 through press working that uses a lower die 93 including an opening 93A where some of the protruding parts 95 of an upper die 94 are inserted and the upper die 94 including a plurality of protruding parts (through hole forming step). This forms a structure corresponding to the metal cover 81 in the metal cover forming area 13 of the metal plate 87 (refer to FIG. 20C). The protruding parts 95 correspond to the shape of the through holes 85. The diameter R1 of the through hole 85 is for example 1 mm.

By separately performing press working for forming the housing part 84 and press working for forming the through holes 85, it is possible to enhance the flatness of the face 84A of the housing part 84 compared with a case where the housing part 84 and the through holes 85 are formed in a single process of press working.

Figure 19D:
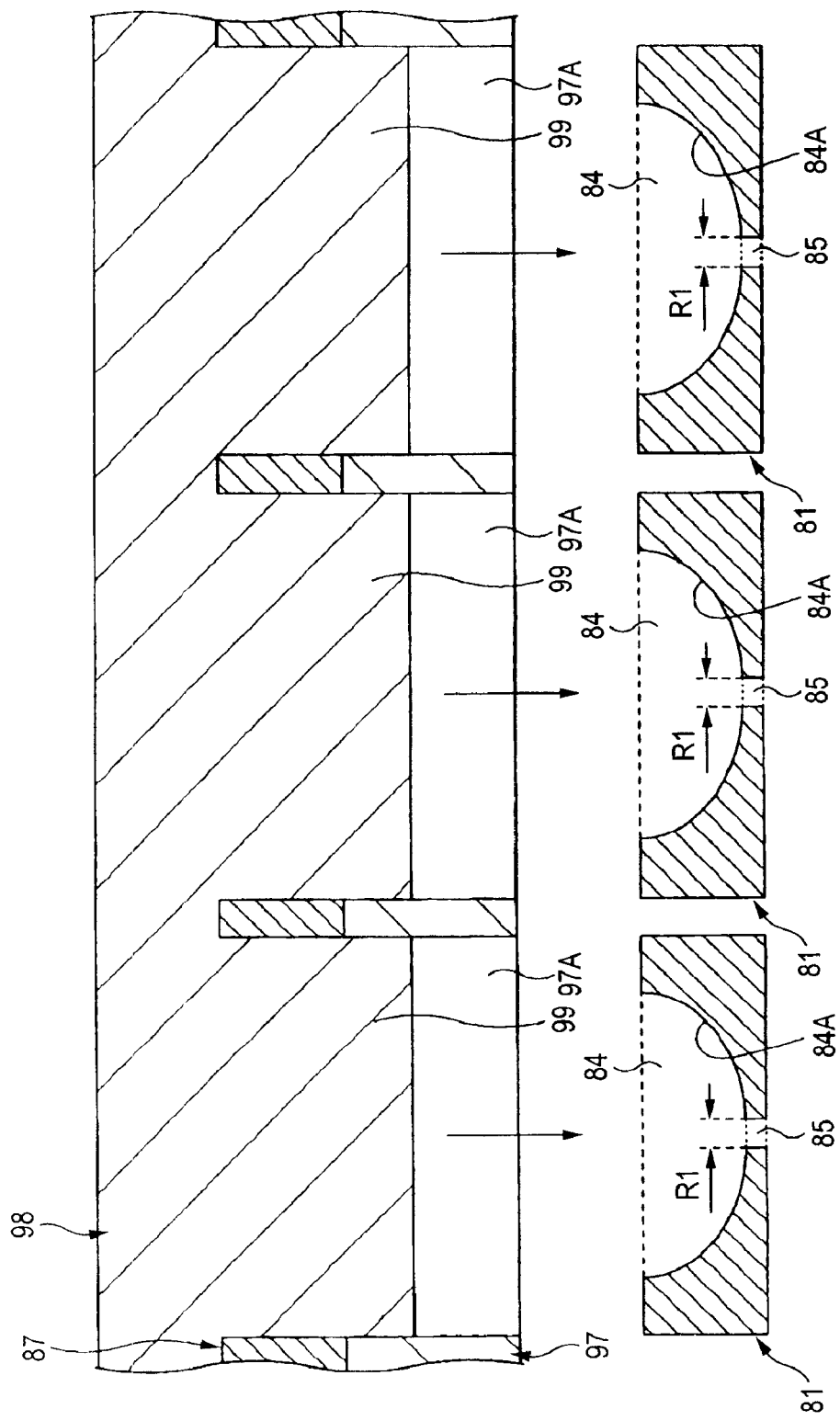
FIG. 19D shows a step of manufacturing a light-emitting device according to the fourth embodiment of the invention.

The step shown in FIG. 19D cuts the metal cover forming area 3 (area where a structure corresponding to the metal cover 81 is formed) out of the metal plate 87 by way of press working that uses a lower die 97 including an opening 97A where some of the protruding parts 99 of an upper die 98 are inserted and the upper die 98 including a plurality of protruding parts 99. This produces a plurality of metal covers 81. The protruding parts 99 correspond to the shapes of the metal cover forming area B and the opening 97A.

In this way, by forming the housing part 84, forming the through holes 85, and punching the metal plate 35 (making the metal cover 81 into individual pieces) by way of press working, it is possible to reduce the manufacturing costs of the metal cover 81 compared with a case where a method other than press working such as use of a dicer is employed to make the metal cover 81 into individual pieces.

Figure 19E:
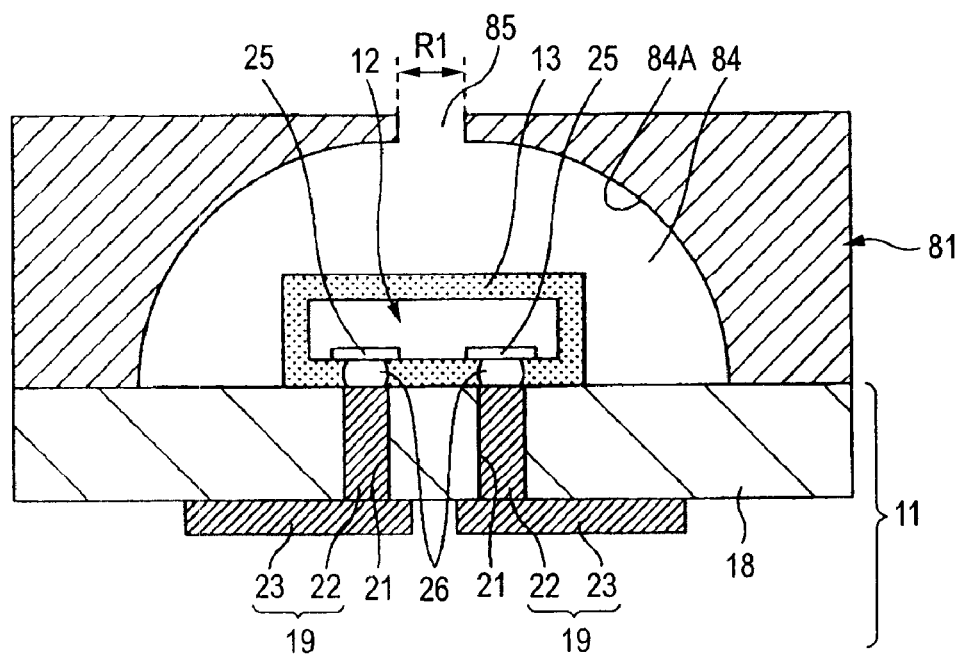
FIG. 19E shows a step of manufacturing a light-emitting device according to the fourth embodiment of the invention.
Figure 19F:
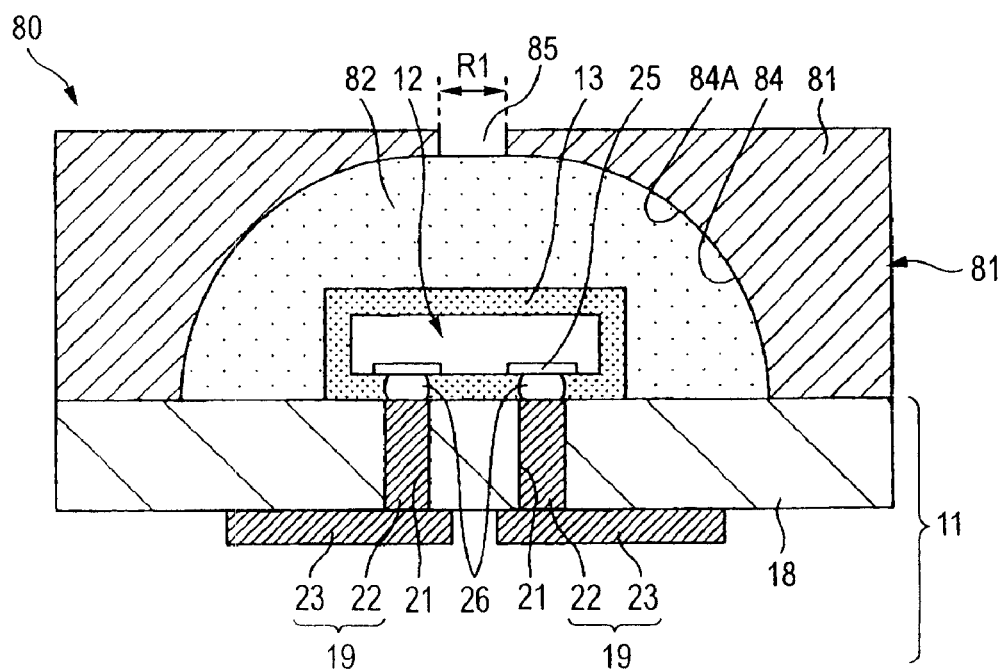
FIG. 19F shows a step of manufacturing a light-emitting device according to the fourth embodiment of the invention.

Next, the step shown in FIG. 19E uses an adhesive (not shown) to fix the metal cover 81 on the structure shown in FIG. 5C. The step shown in FIG. 19F fills the housing part 84 with a sealing resin 82 via through holes 85 to seal the light-emitting element 12 covered with a phosphor-containing resin 13. This produces the light-emitting device 80. For example, a silicone resin may be used as the sealing resin 82.

With the method for manufacturing a light-emitting device according to this embodiment, it is possible to finish the face 84A of the housing part 84 functioning as a reflector into an almost mirror-polished surface by pressing the metal plate 87 to form the housing part 84. This enhances the light-emitting efficiency of the light-emitting device 80.

By separately performing press working for forming the housing part 84 and press working for forming the through holes 85, it is possible to enhance the flatness of the faces 84A of the housing part 84.

Further, by forming the housing part 84, forming the through holes 85, and punching the metal plate 87 (making the metal cover 81 into individual pieces) byway of press working, it is possible to reduce the manufacturing costs of the light-emitting device 80 compared with a case where a method other than press working such as use of a dicer is employed to make the metal cover 81 into individual pieces.

While the preferable embodiments of the invention are described, the invention is not limited to those specific embodiments but various changes and modifications can be made in it without departing from the scope thereof defined in the claims.

While the light-emitting devices 10, 50, 60, 70, 80 are described where the light-emitting element 12 and the wiring pattern 19 are flip-chip connected to each other in the first to fourth embodiments, the invention is also applicable to a light-emitting device where the light-emitting element 12 and the wiring pattern 19 are connected to each other via wire bonding.

While the housing parts 28, 31, 65, 84 are formed by way of press working in the first to fourth embodiments, a method other than press working such as the etching method may be used to form the housing parts 28, 31, 65, 84.

This invention is applicable to a light-emitting device that uses a face of a housing part as a reflector and its manufacturing method.

What is claimed is:

1. A light-emitting device comprising:
    a light-emitting element,
    a substrate having a first and second generally planar surfaces, said light emitting element being mounted directly to said first surface,
    a metal cover mounted directly to said substrate first surface and surrounding said light-emitting element, said metal cover including a housing part for housing the light-emitting element and defining a through hole for transmitting light emitted from the light-emitting element.

2. The light-emitting device according to claim 1, wherein said housing part includes a light reflecting surface surrounding the light-emitting element and extending upwardly from the substrate first surface at a predetermined angle to the substrate first surface so as to reflect light emitted from the light-emitting element at an associated angle generally toward said through hole.

3. The light-emitting device according to claim 1, wherein the substrate is formed of a non-metal material and has a wiring pattern, the wiring pattern including conductive vias and wiring, the wiring being formed on the second surface of the substrate, the vias extending through the substrate from said first surface to said second surface thereof and electrically connecting the wiring to said light-emitting element.

4. The light-emitting device according to claim 2, wherein the substrate is formed of a non-metal material and has a wiring pattern, the wiring pattern including conductive vias and wiring, the wiring being formed on the second surface of the substrate, the vias extending through the substrate from said first surface to said second surface thereof and electrically connecting the wiring to said light-emitting element.

* * * * *